(12) United States Patent
Chae et al.

(10) Patent No.: US 11,552,061 B2
(45) Date of Patent: Jan. 10, 2023

(54) LIGHT EMITTING DEVICE WITH LED STACK FOR DISPLAY AND DISPLAY APPARATUS HAVING THE SAME

(71) Applicant: SEOUL VIOSYS CO., LTD., Ansan-si (KR)

(72) Inventors: Jong Hyeon Chae, Ansan-si (KR); Ho Joon Lee, Ansan-si (KR); Seong Gyu Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/228,601

(22) Filed: Dec. 20, 2018

(65) Prior Publication Data
US 2019/0198485 A1 Jun. 27, 2019

Related U.S. Application Data

(60) Provisional application No. 62/609,480, filed on Dec. 22, 2017.

(51) Int. Cl.
*H01L 25/075* (2006.01)
*H01L 33/62* (2010.01)
(Continued)

(52) U.S. Cl.
CPC ...... *H01L 25/0756* (2013.01); *H01L 33/0075* (2013.01); *H01L 33/0093* (2020.05); *H01L 33/382* (2013.01); *H01L 33/405* (2013.01); *H01L 33/42* (2013.01); *H01L 33/52* (2013.01); *H01L 33/62* (2013.01); *H01L 25/0753* (2013.01); *H01L 33/30* (2013.01);
(Continued)

(58) Field of Classification Search
CPC . H01L 33/382; H01L 33/405; H01L 25/0756; H01L 33/62
See application file for complete search history.

(56) References Cited

U.S. PATENT DOCUMENTS

| 5,583,349 A | 12/1996 | Norman et al. |
| 5,583,350 A | 12/1996 | Norman et al. |

(Continued)

FOREIGN PATENT DOCUMENTS

| CN | 1423345 | 6/2003 |
| CN | 102593290 | 7/2012 |

(Continued)

OTHER PUBLICATIONS

Notice of Allowance dated Mar. 31, 2020, in U.S. Appl. No. 16/234,541.

(Continued)

*Primary Examiner* — Samuel A Gebremariam
*Assistant Examiner* — Jonas T Beardsley
(74) *Attorney, Agent, or Firm* — H.C. Park & Associates, PLC

(57) ABSTRACT

A light emitting device for a display including a first LED sub-unit, a second LED sub-unit disposed on the first LED sub-unit, a third LED sub-unit disposed on the second LED sub-unit, electrode pads disposed under the first LED sub-unit, each of the electrode pads being electrically connected to at least one of the first, second, and third LED sub-units, and lead electrodes electrically connected to the electrode pads and extending outwardly from the first LED sub-unit.

21 Claims, 35 Drawing Sheets

(51) Int. Cl.
  *H01L 33/38* (2010.01)
  *H01L 33/40* (2010.01)
  *H01L 33/42* (2010.01)
  *H01L 33/52* (2010.01)
  *H01L 33/00* (2010.01)
  *H01L 33/30* (2010.01)
  *H01L 33/32* (2010.01)

(52) U.S. Cl.
  CPC ........ *H01L 33/32* (2013.01); *H01L 2933/005* (2013.01); *H01L 2933/0016* (2013.01); *H01L 2933/0066* (2013.01)

(56) References Cited

U.S. PATENT DOCUMENTS

| | | | |
|---|---|---|---|
| 5,696,389 A | 12/1997 | Ishikawa et al. |
| 5,703,436 A | 12/1997 | Forrest et al. |
| 5,707,745 A | 1/1998 | Forrest et al. |
| 5,739,552 A | 4/1998 | Kimura et al. |
| 6,046,543 A | 4/2000 | Bulovic et al. |
| 6,100,103 A | 8/2000 | Shim et al. |
| 6,365,270 B2 | 4/2002 | Forrest et al. |
| 6,717,358 B1 | 4/2004 | Liao et al. |
| 6,888,305 B2 | 5/2005 | Weaver |
| 6,934,309 B2 | 8/2005 | Nishikawa et al. |
| 7,282,741 B2 | 10/2007 | Kim et al. |
| 7,514,720 B2 | 4/2009 | Kim et al. |
| 7,570,310 B2 | 8/2009 | Harada et al. |
| 7,732,803 B2 | 6/2010 | Shum et al. |
| 7,745,986 B2 | 6/2010 | Ito et al. |
| 7,982,228 B2 | 7/2011 | Choi et al. |
| 8,017,955 B2 | 9/2011 | Wang et al. |
| 8,022,421 B2 | 9/2011 | Hsueh et al. |
| 8,035,115 B2 | 10/2011 | Ogihara et al. |
| 8,058,663 B2 | 11/2011 | Fan et al. |
| 8,089,074 B2 | 1/2012 | Kim et al. |
| 8,283,191 B2 | 10/2012 | Rode et al. |
| 8,324,803 B2 | 12/2012 | Forrest et al. |
| 8,390,020 B2 | 3/2013 | Tanaka et al. |
| 8,436,346 B2 | 5/2013 | Ushikubo et al. |
| 8,466,542 B2 | 6/2013 | Kriman et al. |
| 8,546,836 B2 | 10/2013 | Kamiya et al. |
| 8,563,144 B2 | 10/2013 | Kim et al. |
| 8,618,551 B2 | 12/2013 | Nishikawa et al. |
| 8,624,274 B2 | 1/2014 | Hsueh et al. |
| 8,766,295 B2 | 7/2014 | Kim |
| 8,835,948 B2 | 9/2014 | Chang et al. |
| 8,884,316 B2 | 11/2014 | Weaver et al. |
| 8,941,566 B2 | 1/2015 | Haase |
| 9,006,752 B2 | 4/2015 | So et al. |
| 9,018,834 B2 | 4/2015 | Ide et al. |
| 9,052,096 B2 | 6/2015 | Nishimura et al. |
| 9,076,929 B2 | 7/2015 | Katsuno et al. |
| 9,099,631 B2 | 8/2015 | Yang et al. |
| 9,136,498 B2 | 9/2015 | Skipor |
| 9,142,748 B2 | 9/2015 | Ohmae et al. |
| 9,153,750 B2 | 10/2015 | Seo et al. |
| 9,202,994 B2 | 12/2015 | Hashimoto et al. |
| 9,252,380 B2 | 2/2016 | Seo et al. |
| 9,281,446 B2 | 3/2016 | Suh et al. |
| 9,312,249 B2 | 4/2016 | Choi et al. |
| 9,337,400 B2 | 5/2016 | Hashimoto et al. |
| 9,362,335 B2 | 6/2016 | Von Malm |
| 9,406,908 B2 | 8/2016 | Kim et al. |
| 9,419,031 B1 | 8/2016 | Or-Bach et al. |
| 9,443,833 B2 | 9/2016 | Oraw |
| 9,515,278 B2 | 12/2016 | Suzuki et al. |
| 9,559,263 B2 | 1/2017 | Matsui et al. |
| 9,577,012 B2 | 2/2017 | Ooki et al. |
| 9,748,313 B2 | 8/2017 | Tsuji et al. |
| 9,786,817 B2 | 10/2017 | Kim et al. |
| 9,786,859 B2 | 10/2017 | Yamae et al. |
| 9,847,051 B2 | 12/2017 | Choi et al. |
| 9,853,187 B2 | 12/2017 | Kim |
| 9,893,233 B2 | 2/2018 | Kong et al. |
| 9,905,725 B2 | 2/2018 | Lee |
| 9,960,212 B2 | 5/2018 | Gee et al. |
| 9,960,390 B2 | 5/2018 | Höfle et al. |
| 9,966,369 B2 | 5/2018 | Kim et al. |
| 10,056,535 B2 | 8/2018 | Chang et al. |
| 10,069,036 B2 | 9/2018 | Atanackovic |
| 10,079,265 B1 | 9/2018 | Wu et al. |
| 10,134,813 B2 | 11/2018 | Choi |
| 10,170,666 B2 | 1/2019 | Cha et al. |
| 10,205,058 B2 | 2/2019 | Lee |
| 10,304,811 B2 | 5/2019 | Zhang et al. |
| 10,326,056 B2 | 6/2019 | Jung et al. |
| 10,381,519 B2 | 8/2019 | Seo et al. |
| 10,388,978 B2 | 8/2019 | Morris-Cohen et al. |
| 10,418,577 B2 | 9/2019 | Yoo et al. |
| 10,475,957 B2 | 11/2019 | Cha et al. |
| 10,515,580 B2 | 12/2019 | Henry et al. |
| 10,559,557 B2 | 2/2020 | Chang et al. |
| 10,586,896 B2 | 3/2020 | Shioji |
| 10,686,099 B2 | 6/2020 | Huppmann et al. |
| 10,686,149 B2 | 6/2020 | Park et al. |
| 10,811,475 B2 | 10/2020 | Zhang et al. |
| 2002/0154259 A1 | 10/2002 | Freidhoff et al. |
| 2003/0047742 A1 | 3/2003 | Hen |
| 2003/0168989 A1 | 9/2003 | Hen |
| 2003/0213967 A1 | 11/2003 | Forrest et al. |
| 2004/0232433 A1 | 11/2004 | Doverspike et al. |
| 2005/0062049 A1 | 3/2005 | Lin et al. |
| 2005/0067627 A1 | 3/2005 | Shen et al. |
| 2005/0140278 A1 | 6/2005 | Kato |
| 2005/0264550 A1 | 12/2005 | Ohshima et al. |
| 2006/0027820 A1 | 2/2006 | Cao |
| 2006/0231852 A1 | 10/2006 | Kususe et al. |
| 2006/0258026 A1 | 11/2006 | Miyachi et al. |
| 2007/0069220 A1 | 3/2007 | Ogihara |
| 2007/0170444 A1 | 7/2007 | Cao |
| 2007/0222922 A1 | 9/2007 | Jin et al. |
| 2008/0068315 A1 | 3/2008 | Kurosaki et al. |
| 2008/0099770 A1 | 5/2008 | Mendendorp et al. |
| 2008/0128728 A1 | 6/2008 | Nemchuk et al. |
| 2008/0130278 A1 | 6/2008 | Ushikubo et al. |
| 2008/0251799 A1 | 10/2008 | Ikezawa |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0114931 A1 | 5/2009 | Hsueh et al. |
| 2009/0272989 A1 | 11/2009 | Shum et al. |
| 2010/0032691 A1 | 2/2010 | Kim |
| 2010/0045175 A1 | 2/2010 | Mathai et al. |
| 2010/0051975 A1 | 3/2010 | Suzuki et al. |
| 2010/0065867 A1 | 3/2010 | Unno |
| 2010/0066239 A1 | 3/2010 | Spindler et al. |
| 2010/0076527 A1 | 3/2010 | Hammond et al. |
| 2010/0084668 A1 | 4/2010 | Choi et al. |
| 2010/0144073 A1 | 6/2010 | Louwsma et al. |
| 2010/0159792 A1 | 6/2010 | Msser et al. |
| 2010/0224860 A1 | 9/2010 | Ibbetson et al. |
| 2010/0276706 A1* | 11/2010 | Herrmann ............... H01L 33/62 257/89 |
| 2011/0057211 A1 | 3/2011 | Lee et al. |
| 2011/0086486 A1 | 4/2011 | Lee et al. |
| 2011/0156114 A1 | 6/2011 | Park et al. |
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0124903 A1 | 5/2012 | Takeuchi |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0009543 A1 | 1/2013 | Kadoma et al. |
| 2013/0056717 A1 | 3/2013 | Ishihara et al. |
| 2013/0056785 A1 | 3/2013 | Hwang |
| 2013/0069191 A1 | 3/2013 | Or-Bach et al. |
| 2013/0264587 A1 | 10/2013 | Chang |
| 2013/0285076 A1 | 10/2013 | Liu et al. |
| 2013/0292711 A1 | 11/2013 | Ogihara et al. |

(56) References Cited

U.S. PATENT DOCUMENTS

| | | | |
|---|---|---|---|
| 2014/0184062 A1 | 7/2014 | Kolodin | |
| 2014/0191243 A1 | 7/2014 | Singh et al. | |
| 2014/0252382 A1 | 9/2014 | Hashimoto et al. | |
| 2014/0284633 A1 | 9/2014 | Tsay et al. | |
| 2015/0001572 A1 | 1/2015 | Katsuno et al. | |
| 2015/0099728 A1 | 4/2015 | Frank et al. | |
| 2015/0221627 A1 | 8/2015 | Nielson et al. | |
| 2015/0325555 A1 | 11/2015 | Hashimoto et al. | |
| 2015/0340348 A1 | 11/2015 | Katsuno et al. | |
| 2015/0362165 A1 | 12/2015 | Chu et al. | |
| 2016/0005375 A1 | 1/2016 | Naijo et al. | |
| 2016/0043290 A1 | 2/2016 | Sogo et al. | |
| 2016/0064439 A1 | 3/2016 | Or-Bach et al. | |
| 2016/0099384 A1 | 4/2016 | Kim et al. | |
| 2016/0155378 A1 | 6/2016 | Hack et al. | |
| 2016/0155892 A1 | 6/2016 | Li et al. | |
| 2016/0163940 A1 | 6/2016 | Huang et al. | |
| 2016/0315068 A1 | 10/2016 | Lee et al. | |
| 2016/0322293 A1 | 11/2016 | Kimura et al. | |
| 2016/0336482 A1 | 11/2016 | Lu et al. | |
| 2016/0359143 A1 | 12/2016 | Osawa et al. | |
| 2017/0012173 A1 | 1/2017 | Lee et al. | |
| 2017/0025593 A1 | 1/2017 | Bower et al. | |
| 2017/0062680 A1 | 3/2017 | Yoo et al. | |
| 2017/0064785 A1 | 3/2017 | Kim et al. | |
| 2017/0069612 A1 | 3/2017 | Zhang et al. | |
| 2017/0084876 A1 | 3/2017 | Suzuki | |
| 2017/0104035 A1 | 4/2017 | Lee et al. | |
| 2017/0117259 A1 | 4/2017 | Xu | |
| 2017/0133357 A1 | 5/2017 | Kuo et al. | |
| 2017/0162746 A1 | 6/2017 | Cha et al. | |
| 2017/0194298 A1 | 7/2017 | Negley et al. | |
| 2017/0194535 A1 | 7/2017 | Park et al. | |
| 2017/0213502 A1 | 7/2017 | Henry et al. | |
| 2017/0236866 A1 | 8/2017 | Lee et al. | |
| 2017/0250329 A1 | 8/2017 | Takeya et al. | |
| 2017/0286044 A1 | 10/2017 | Kim et al. | |
| 2017/0288088 A1 | 10/2017 | Won Cheol | |
| 2017/0288093 A1* | 10/2017 | Cha | H01L 33/08 |
| 2017/0331009 A1* | 11/2017 | Shioji | H01L 33/502 |
| 2017/0331021 A1 | 11/2017 | Chae et al. | |
| 2017/0338275 A1 | 11/2017 | Banna et al. | |
| 2017/0345801 A1 | 11/2017 | Lin et al. | |
| 2018/0040665 A1 | 2/2018 | Ohmae et al. | |
| 2018/0083170 A1 | 3/2018 | Shepherd | |
| 2018/0151548 A1 | 5/2018 | Pfeuffer et al. | |
| 2018/0156965 A1 | 6/2018 | El-Ghoroury et al. | |
| 2018/0158808 A1 | 6/2018 | Zhang et al. | |
| 2018/0166499 A1 | 6/2018 | Pfeuffer et al. | |
| 2018/0233492 A1 | 8/2018 | Liu et al. | |
| 2018/0240952 A1 | 8/2018 | Moon et al. | |
| 2018/0283642 A1 | 10/2018 | Liao et al. | |
| 2019/0053347 A1 | 2/2019 | Lee et al. | |
| 2019/0074324 A1 | 3/2019 | Kim et al. | |
| 2019/0097088 A1 | 3/2019 | Huppmann et al. | |
| 2019/0148612 A1 | 5/2019 | Lee et al. | |
| 2019/0165207 A1 | 5/2019 | Kim et al. | |
| 2019/0181181 A1 | 6/2019 | Yeon et al. | |
| 2019/0229149 A1 | 7/2019 | Yoo | |
| 2019/0267436 A1 | 8/2019 | Zhang et al. | |
| 2019/0333964 A1 | 10/2019 | Lee et al. | |
| 2020/0063920 A1 | 2/2020 | Vampola | |
| 2020/0212017 A1* | 7/2020 | Oh | H01L 33/62 |
| 2020/0212262 A1 | 7/2020 | Jang et al. | |
| 2020/0219858 A1 | 7/2020 | Chang | |

FOREIGN PATENT DOCUMENTS

| | | |
|---|---|---|
| CN | 102593303 | 7/2012 |
| CN | 105789237 | 7/2016 |
| CN | 106848043 | 6/2017 |
| CN | 107342352 | 5/2019 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2017-204571 | 11/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2016152321 | 9/2016 |
| WO | 2017153123 | 9/2017 |

OTHER PUBLICATIONS

Notice of Allowance dated Apr. 9, 2020, in U.S. Appl. No. 16/198,792.

Non-Final Office Action dated Apr. 15, 2020, in U.S. Appl. No. 16/198,873.

Final Office Action dated Apr. 20, 2020, in U.S. Appl. No. 16/228,621.

Notice of Allowance dated Mar. 12, 2020, in U.S. Appl. No. 16/198,784.

Non-Final Office Action dated Mar. 23, 2020, in U.S. Appl. No. 16/219,716.

Notice of Allowance dated Feb. 10, 2020, in U.S. Appl. No. 16/198,796.

Final Office Action for U.S. Appl. No. 16/198,873 dated Oct. 15, 2020.

Notice of Allowance for U.S. Appl. No. 16/198,796 dated Aug. 26, 2020.

Notice of Allowance for U.S. Appl. No. 16/219,716 dated Sep. 3, 2020.

Non-Final Office Action for U.S. Appl. No. 16/673,114 dated Sep. 3, 2020.

Non-Final Office Action for U.S. Appl. No. 16/200,036 dated Sep. 24, 2020.

Non-Final Office Action for U.S. Appl. No. 16/228,621 dated Sep. 29, 2020.

Notice of Allowance for U.S. Appl. No. 16/236,737 dated Oct. 28, 2020.

(56) References Cited

OTHER PUBLICATIONS

Non-Final Office Action for U.S. Appl. No. 16/198,784 dated Nov. 19, 2020.
Final Office Action dated May 29, 2020, in U.S. Appl. No. 16/198,850.
Non-Final Office Action dated Jun. 24, 2020, in U.S. Appl. No. 16/236,737.
Final Office Action dated Jul. 23, 2020, in U.S. Appl. No. 16/673,184.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.
Final Office Action dated Apr. 21, 2021, in U.S. Appl. No. 16/198,784.
Final Office Action dated Mar. 25, 2021 in U.S. Appl. No. 16/200,036.
Non-Final Office Action dated Apr. 7, 2021, in U.S. Appl. No. 16/915,384.
Non-Final Office Action dated Apr. 15, 2021, in U.S. Appl. No. 16/673,184.
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Non-Final Office Action dated Jun. 10, 2021, in U.S. Appl. No. 16/198,873.
Final Office Action dated Dec. 2, 2021, in U.S. Appl. No. 16/228,621.
Notice of Allowance dated Dec. 9, 2021, in U.S. Appl. No. 16/915,384.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Final Office Action dated Nov. 12, 2021, in U.S. Appl. No. 16/673,184.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 29, 2021, in European Patent Application No. 18891199.4.
Extended European Search Report dated Oct. 5, 2021, in European Patent Application No. 18882087.2.
Extended European Search Report dated Sep. 14, 2021, in European Patent Application No. 18881496.6.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal drafted on Sep. 14, 2021, in Japanese Patent Application No. 2020-532747.
Notice of Allowance dated Sep. 14, 2021, in U.S. Appl. No. 16/899,522.
Final Office Action dated Sep. 30, 2021, in U.S. Appl. No. 16/198,850.
Notice of Allowance dated Sep. 22, 2021, in U.S. Appl. No. 16/200,036.
Final Office Action dated Sep. 27, 2021, in U.S. Appl. No. 16/915,384.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Oct. 24, 2019, in U.S. Appl. No. 16/228,621.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action issued on Nov. 19, 2019, in U.S. Appl. No. 16/198,796.
Non-Final Office Action dated Oct. 31, 2019, in U.S. Appl. No. 16/198,850.
Non-Final Office Action dated Jan. 9, 2020, in U.S. Appl. No. 16/673,184.
Notice of Allowance issued in U.S. Appl. No. 16/228,621 dated Feb. 17, 2022.

(56) References Cited

OTHER PUBLICATIONS

Notice of Allowance issued in U.S. Appl. No. 16/673,184 dated Mar. 15, 2022.
Notice of Allowance issued in U.S. Appl. No. 16/198,873 dated Mar. 16, 2022.
Examination Report issued in Indian Patent Application 202037026094 dated Mar. 28, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/988,272 dated Jun. 8, 2022.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Notice of Allowance issued in U.S. Appl. No. 16/673,184 dated Jun. 23, 2022.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Notice of Allowance issued in U.S. Appl. No. 16/915,384 dated Nov. 8, 2022.
Office Action dated Nov. 22, 2022 for Japanese Patent Application No. 2020-526484(with English Translation).

\* cited by examiner

LIGHT EMITTING DEVICE WITH LED STACK FOR DISPLAY AND DISPLAY APPARATUS HAVING THE SAME

CROSS REFERENCE TO RELATED APPLICATION

This application claims priority from and the benefit of U.S. Provisional Application No. 62/609,480, filed on Dec. 22, 2017, which is hereby incorporated by reference for all purposes as if fully set forth herein.

BACKGROUND

Field

Exemplary embodiments of the invention relate to a light emitting device for a display and a display apparatus having the same and, more specifically, to a micro light emitting device having a stacked structure and a display apparatus having the same.

Discussion of the Background

As an inorganic light source, light emitting diodes (LEDs) have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as backlight light sources in display apparatus. However, a micro LED display has been recently developed that is capable of implementing an image directly using the light emitting diodes.

In general, a display apparatus implements various colors by using mixed colors of blue, green and, red light. The display apparatus includes pixels each having subpixels corresponding to blue, green, and red colors, and a color of a certain pixel may be determined based on the colors of the sub-pixels therein, and an image can be displayed through combination of the pixels.

Since LEDs can emit various colors depending upon materials thereof, a display apparatus may have individual LED chips emitting blue, green and red light arranged on a two-dimensional plane. However, when one LED chip is provided for each subpixel, the number of LED chips required to be mounted to form a display device becomes very large, e.g., over hundreds of thousands or millions, which may require a significant amount of time and complexity for the mounting process.

Moreover, since the subpixels are arranged on the two-dimensional plane in a display apparatus, a relatively large area is required for one pixel including the subpixels for blue, green, and red light. However, reducing a luminous area of each subpixel would deteriorate the brightness of subpixels.

Furthermore, the micro-LED typically has a very small size with a surface area of about 10,000 square µm or less, and thus, there are various problems due to this small size. For example, it may be difficult to perform probing during measurement of electrical or optical characteristics of the LEDs.

The above information disclosed in this Background section is only for understanding of the background of the inventive concepts, and, therefore, it may contain information that does not constitute prior art.

SUMMARY

Light emitting stacked structures constructed according to the principles and some exemplary implementations of the invention are capable of increasing the light emitting area of each subpixel without increasing the size of the pixel area.

Light emitting diodes and display using the light emitting diodes, e.g., micro LEDs, constructed according to the principles and some exemplary implementations of the invention have a simplified structure that reduces time for a mounting process during manufacture.

Light emitting diodes and display using the light emitting diodes, e.g., micro LEDs, constructed according to the principles and some exemplary implementations of the invention have a structure by which a probe test may be easily conducted for measuring electrical and optical characteristics of the light emitting diodes.

Light emitting diodes and display using the light emitting diodes, e.g., micro LEDs, constructed according to the principles and some exemplary implementations of the invention improve manufacturing productivity by having a structure that can be easily separated from a temporary substrate while being stably disposed thereon.

Additional features of the inventive concepts will be set forth in the description which follows, and in part will be apparent from the description, or may be learned by practice of the inventive concepts.

A light emitting device for a display according to an exemplary embodiment includes a first LED sub-unit, a second LED sub-unit disposed on the first LED sub-unit, a third LED sub-unit disposed on the second LED sub-unit, electrode pads disposed under the first LED sub-unit, each of the electrode pads being electrically connected to at least one of the first, second, and third LED sub-units, and lead electrodes electrically connected to the electrode pads and extending outwardly from the first LED sub-unit.

The first LED sub-unit, the second LED sub-unit, and the third LED sub-unit may be independently drivable, light generated from the first LED sub-unit may be configured to be emitted to the outside of the light emitting device through the second LED sub-unit and the third LED sub-unit, and light generated from the second LED sub-unit may be configured to be emitted to the outside of the light emitting device through the third LED sub-unit.

The first, second, and third LED sub-units comprise first, second, and third LED stacks may be configured to emit red light, green light, and blue light, respectively.

The lead electrodes may have bonding pads disposed on an outer side of the first LED sub-unit.

The light emitting device may further include a transparent member covering the first, second, and third LED sub-units.

The light emitting device may further include a lower insulation layer interposed between the electrode pads and the lead electrodes, in which the lead electrodes may be connected to the electrode pads through the lower insulation layer.

The lower insulation layer may include at least one of a transparent insulation layer, a white insulation layer, and a black insulation layer.

The light emitting device may further include a transparent member covering the first, second, and third LED sub-units, in which the lower insulation layer may be disposed under the transparent member.

Side surfaces of the transparent member and side surfaces of the lower insulation layer may be substantially flush with each other.

The electrode pads may include a common electrode pad commonly electrically connected to the first, second, and third LED sub-units, and first, second, and third electrode pads may be electrically connected to the first, second, and third LED sub-units, respectively, and the lead electrodes may include a common lead electrode electrically connected to the common electrode pad, and first, second, and third lead electrodes electrically connected to the first, second, and third electrode pads, respectively.

The light emitting device may further include an ohmic electrode in ohmic contact with a first conductivity type semiconductor layer of the first LED sub-unit, and a first reflection electrode interposed between the electrode pads and the first LED sub-unit, and in ohmic contact with the first LED sub-unit, in which the first electrode pad may be electrically connected to the ohmic electrode, and the common electrode pad may be electrically connected to the first reflection electrode at a lower portion of the first reflection electrode.

The first reflection electrode may include an ohmic contact layer in ohmic contact with a second conductivity type semiconductor layer of the first LED sub-unit, and a reflection layer covering the ohmic contact layer.

The light emitting device may further include a second transparent electrode interposed between the first LED sub-unit and the second LED sub-unit, and in ohmic contact with a lower surface of the second LED sub-unit, a third transparent electrode interposed between the second LED sub-unit and the third LED sub-unit, and in ohmic contact with a lower surface of the third LED sub-unit, and a common connector connecting the second transparent electrode and the third transparent electrode to the first reflection electrode, in which the common connector may be electrically connected to the first reflection electrode at an upper portion of the first reflection electrode, and to the common electrode pad through the first reflection electrode.

The common connector may include a first common connector passing through the first LED sub-unit, a second common connector electrically connecting the second transparent electrode and the first common connector, and a third common connector electrically connecting the third transparent electrode and the second common connector, and the first common connector and the second common connector may have pad regions to connect the second common connector and the third common connector, respectively.

The light emitting device may further include a first color filter interposed between the first LED sub-unit and the second transparent electrode, and a second color filter interposed between the second LED sub-unit and the third transparent electrode, in which the first color filter may transmit light generated in the first LED sub-unit, and reflect light generated in the second LED sub-unit, and the second color filter may transmit light generated in the first and second LED sub-units, and reflect light generated in the third LED sub-unit.

The light emitting device may further include a second connector to electrically connect the second LED sub-unit and the second electrode pad, and a third connector to electrically connect the third LED sub-unit and the third electrode pad, in which the second connector may be electrically connected to a first conductivity type semiconductor layer of the second LED sub-unit, and the third connector may be electrically connected to a first conductivity type semiconductor layer of the third LED sub-unit.

At least one of the second connector and the third connector may directly contact the first conductivity type semiconductor layer.

The second connector may include a second lower connector passing through the first LED sub-unit and a second upper connector passing through the second LED sub-unit, and the third connector may include a third lower connector passing through the first LED sub-unit, a third middle connector passing through the second LED sub-unit, and a third upper connector passing through the third LED sub-unit.

The light emitting device may further include connectors to electrically connect the second and third LED sub-units to the electrode pads, in which the connectors and the electrode pads may include different materials from each other.

A display apparatus according to an exemplary embodiment includes a circuit board, and a plurality of light emitting devices arranged on the circuit board, at least one of the light emitting devices including a first LED sub-unit, a second LED sub-unit disposed on the first LED sub-unit, a third LED sub-unit disposed on the second LED sub-unit, electrode pads disposed under the first LED sub-unit, each of the electrode pads being electrically connected to at least one of the first, second, and third LED sub-units, and lead electrodes electrically connected to the electrode pads and extending outwardly from the first LED sub-unit, in which the electrode pads of the light emitting device are electrically connected to the circuit board.

A method of manufacturing a light emitting device for a display according to an exemplary embodiment includes providing a support substrate, forming a sacrificial layer on the support substrate, forming a membrane on the sacrificial layer, forming a light emitting diode stack having an isolation region on the support substrate, the light emitting diode stack including a first LED sub-unit, a second LED sub-unit, and a third LED sub-unit, removing the sacrificial layer, and separating the light emitting diode stack and the membrane from the support substrate.

The method of manufacturing the light emitting device may further include etching the membrane to form first openings that expose the sacrificial layer, in which the first openings may be spaced apart by a first portion of the membrane, and the first portion of the membrane may overlap the isolation region of the light emitting diode stack.

The first portion of the membrane may be formed before bonding the first LED sub-unit to the support substrate or after forming the isolation region in the first, second, and third LED sub-units.

The light emitting diode stack may further include electrode pads disposed under the first LED sub-unit and electrically connected to one of the first, second, and third LED sub-unit.

The method of manufacturing the light emitting device may further include forming a lower insulation layer under the electrode pads of the light emitting diode stack separated from the support substrate, patterning the lower insulation layer to form second openings that expose the electrode pads, and forming lead electrodes connected to each of the electrode pads through the second openings.

The first openings may substantially surround the light emitting diode stack in a plan view.

The step of forming the membrane may include forming a center portion overlapping the light emitting diode stack and an outer portion not overlapping the light emitting diode stack with the first portion being disposed between the center portion and the outer portion, in which the first portion of the membrane may connect the center portion and the outer portion after the sacrificial layer is removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
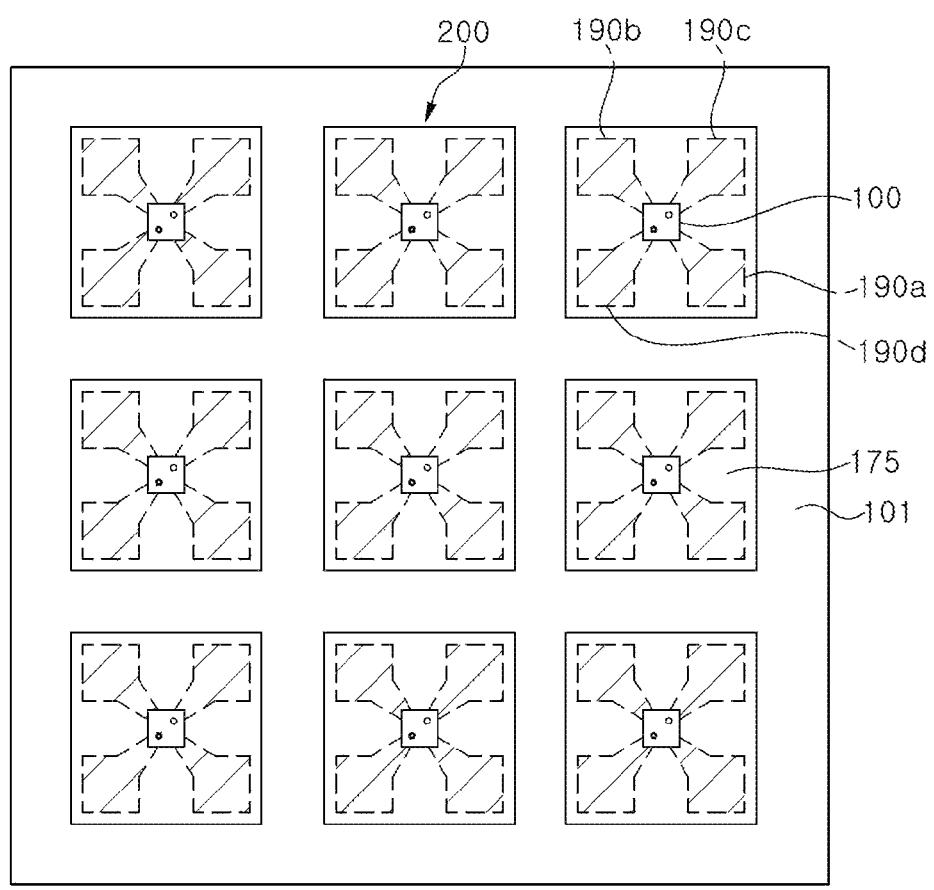
FIG. 1 is a schematic plan view of a display apparatus constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings. As used herein, a light emitting device or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application.

FIG. 1 is a schematic plan view of a display apparatus according to an exemplary embodiment.

Referring to FIG. 1, the display apparatus according to an exemplary embodiment includes a circuit board 101 and a plurality of light emitting devices 200 disposed thereon.

The circuit board 101 may include a circuit for passive matrix driving or active matrix driving. In one exemplary embodiment, the circuit board 101 may include interconnection lines and resistors. In another exemplary embodiment, the circuit board 101 may include interconnection lines, transistors, and capacitors. The circuit board 101 may also have electrode pads disposed on an upper surface thereof to allow electrical connection to the circuit therein.

The light emitting devices 200 are arranged on the circuit board 101. Each light emitting device 200 may constitute one pixel. The light emitting device 200 has lead electrodes 190a, 190b, 190c, and 190d, a light emitting diode stack 100 and a molding member. The lead electrodes 190a, 190b, 190c, and 190d are electrically connected to the circuit board 101. The light emitting devices 200 are disposed on the circuit board 101 and are spaced apart from one another.

Each of the light emitting devices 200 includes a light emitting diode stack 100. Each light emitting diode stack 100 may have electrode pads on a lower surface thereof. Each of the lead electrodes 190a, 190b, 190c, and 190d is connected to the electrode pads.

Figure 2A:
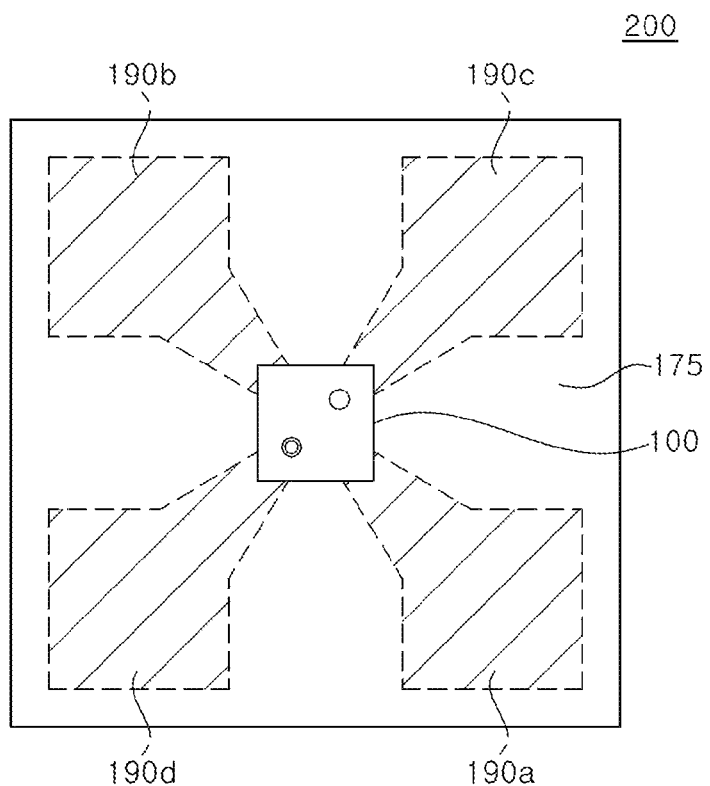
FIG. 2A is a schematic plan view of a light emitting device constructed according to an exemplary embodiment of the invention.
Figure 2B:
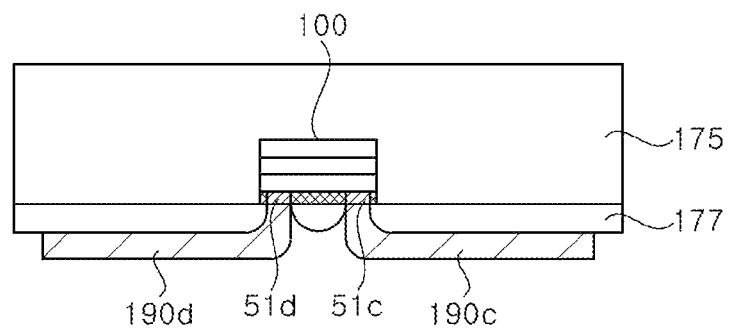
FIG. 2B is a cross-sectional view of FIG. 2A.

FIG. 2A is a schematic plan view of a light emitting device 200 according to an exemplary embodiment, and FIG. 2B is a schematic cross-sectional view taken along diagonal direction of FIG. 2A.

Referring to FIGS. 2A and 2B, the light emitting device 200 according to an exemplary embodiment include a light emitting diode stack 100, a lower insulation layer 177, lead electrodes 190a, 190b, 190c, and 190d, and a transparent molding member 175.

Figure 5A:
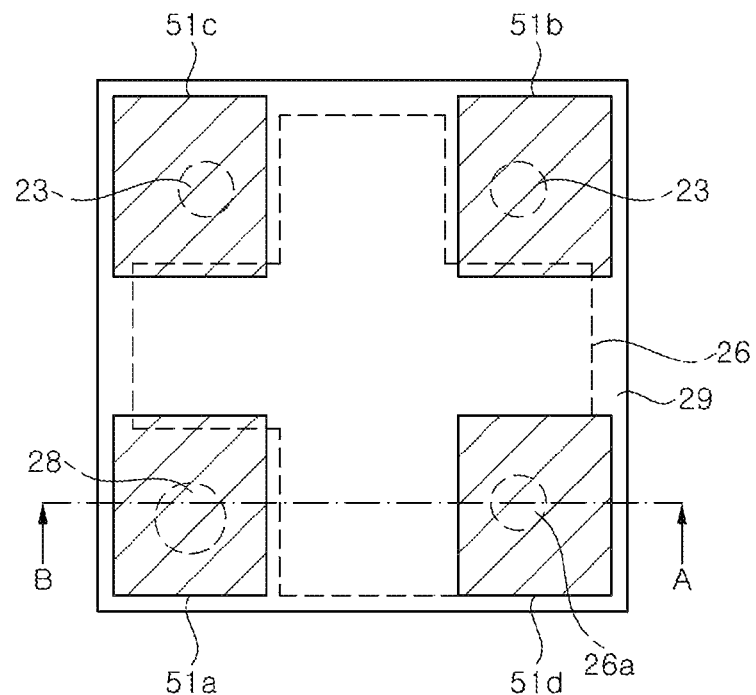

The light emitting diode stack 100 may include first, second, and third LED stacks, and the electrode pads may be electrically connected to the first to third LED stacks. Although FIG. 2B shows two electrode pads 51c and 51d, the electrode pads 51a and 51b may also be disposed under the light emitting diode stack 100 as shown in FIG. 5A. A structure of the light emitting diode stack 100 will be described in more detail below.

The molding member 175 covers side surfaces and an upper surface of the light emitting stack 100. The molding member 175 may be formed of transparent resin, glass, or others, and is transparent to light emitted from the light emitting diode stack 100.

The lower insulation layer 177 may be disposed under the molding member 175. The lower insulation layer 177 may be formed of a transparent insulation layer, but the inventive concepts are not limited thereto. For example, the lower insulation layer 177 may include a white insulation layer or a black insulation layer to reflect or absorb light. Examples of the transparent insulation layer include SU8, polyimide, penylene, or others, an example of the white insulation layer includes white PSR (photo sensitive resist), and an example of the black insulation layer includes black epoxy.

The lower insulation layer 177 is interposed between the lead electrodes 190a, 190b, 190c, and 190d and the light emitting diode stack 100, and has openings to expose the electrode pads 51a, 51b, 51c, and 51d.

The lead electrodes 190a, 190b, 190c, and 190d may be connected to the electrode pads 51a, 51b, 51c, and 51d through the openings of the lower insulation layer 177. The lead electrodes 190a, 190b, 190c, and 190d extend to the outside from a lower region of the light emitting diode stack 100. In particular, each of the lead electrodes 190a, 190b, 190c, and 190d may have a bonding pad outside the lower region of the LED stack 100, and the bonding pads may be bonded to the circuit board 101 of FIG. 1.

FIGS. 3A, 3B, 4A, 4B, 5A, 5B, 6, 7, 8A, 8B, 9A, 9B, 9C, 9D, 9E, 10A, 10B, 11A, 11B, 11C, 11D, 11E, 11F, 11G, 12A, 12B, 13A, 13B, 14A, 14B, 15A, 15B, 16A, 16B, 17A, 17B, 18A, 18B, 19A, 19B, 20A, 20B, 21A, 21B, 22, 23A, 23B, 23C, 23D, 23E, 23F, 23G, 23H, and 23I are schematic plan views and cross-sectional views illustrating a method of manufacturing a light emitting device for a display according to exemplary embodiments.

Figure 3A:
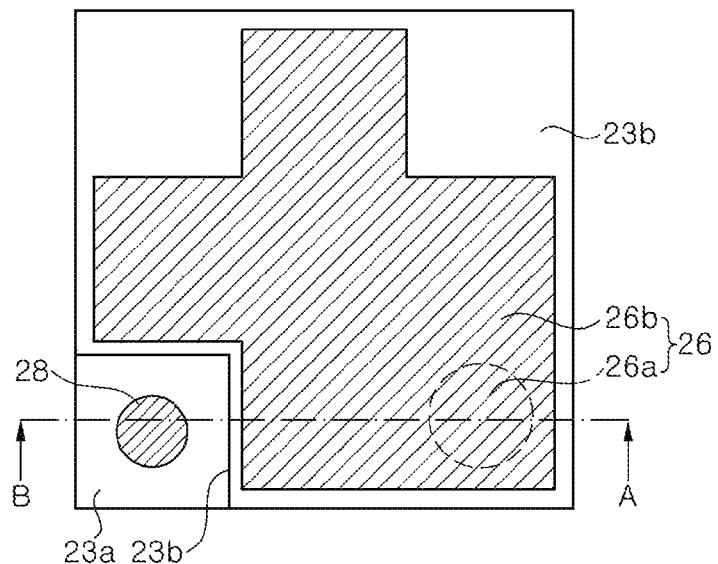
FIGS. 3A, 3B, 4A, 4B, 5A, 5B, 6, 7, 8A, 8B, 9A, 9B, 9C, 9D, 9E, 10A, 10B, 11A, 11B, 11C, 11D, 11E, 11F, 11G, 12A, 12B, 13A, 13B, 14A, 14B, 15A, 15B, 16A, 16B, 17A, 17B, 18A, 18B, 19A, 19B, 20A, 20B, 21A, 21B, 22, 23A, 23B, 23C, 23D, 23E, 23F, 23G, 23H, and 23I are schematic plan views and cross-sectional views illustrating a method of manufacturing a light emitting device for a display according to exemplary embodiments.
Figure 3B:
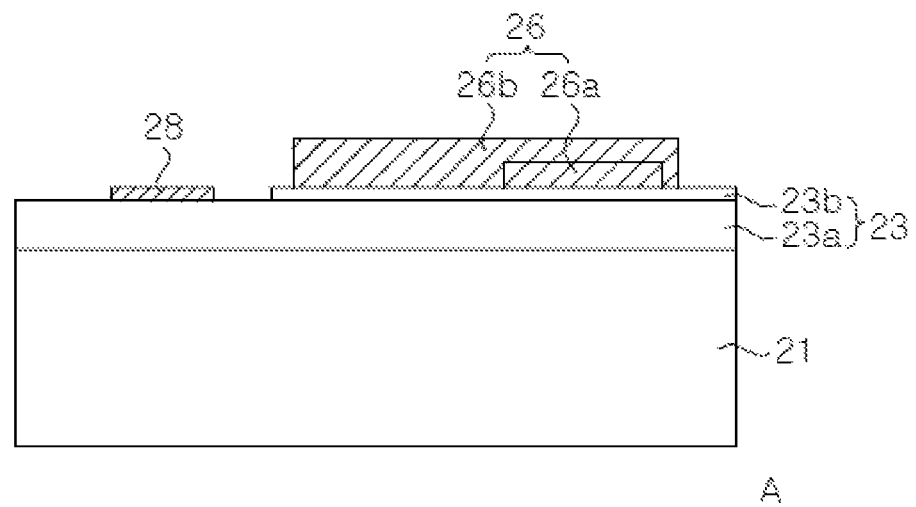

Referring to FIGS. 3A and 3B, a first LED stack 23 is grown on a first substrate 21. The first substrate 21 may be a GaAs substrate, for example. The first LED stack 23 may be formed of AlGaInP-based semiconductor layers, and includes a first conductivity type semiconductor layer 23a, an active layer, and a second conductivity type semiconductor layer 23b. The first conductivity type may be an n-type, and the second conductivity type may be a p-type.

The second conductivity type semiconductor layer 23b is partially removed to expose the first conductivity type semiconductor layer 23a. Although FIGS. 3A and 3B show one single region of the light emitting device, the substrate 21 may include a plurality of regions of the light emitting device, and the first conductivity type semiconductor layer 23a may be exposed in each region of light emitting device.

Thereafter, an ohmic contact layer 26a is formed on the second conductivity type semiconductor layer 23b, and a reflection layer 26b covering the ohmic contact layer 26a is formed. The ohmic contact layer 26a and the reflection layer 26b may be formed using a lift-off technique, for example. A first reflection electrode 26 is formed by the ohmic contact layer 26a and the reflection layer 26b.

In another exemplary embodiment, an insulation layer having openings may be formed, an ohmic contact layer 26a may be formed in the openings of the insulation layer, and a reflection layer 26b covering the ohmic contact layer 26a and an insulation layer 25 may be formed.

The ohmic contact layer 26a may be formed of Au—Te alloys or Au—Ge alloys, for example. The reflection layer 26b may include a reflective metal layer, such as Al, Ag, or Au. In addition, the reflection layer 26b may include an adhesive metal layer of Ti, Ta, Ni, Cr, or others on upper and lower surfaces of the reflective metal layer to improve an adhesion of the reflective metal layer. In an exemplary embodiment, Au may be used as the reflection layer 26b formed in the first LED stack 23 due to its high reflectance to red light and low reflectance to blue and green light. The reflection layer 26b occupies a larger area than the ohmic contact layer 26a, and may covers at least 50% of an area of the light emitting device. In some exemplary embodiments, the reflection layer 26b may cover most of the area to improve luminous efficiency.

The first reflection electrode 26 may have a shape in which three corner portions are removed from one single rectangular region of the light emitting device as shown in the drawing. The ohmic contact layer 26a may be partially disposed in the remaining one corner portion. However, the inventive concepts are not limited thereto, and the ohmic contact layer 26a may be widely distributed over the region of the light emitting device.

Although FIGS. 3A and 3B show one single region of the light emitting device is shown, a plurality of regions of the light emitting device may be provided on the substrate 21, and the first reflection electrode 26 is formed in each region of the light emitting device.

An ohmic electrode 28 is formed on the exposed first conductivity type semiconductor layer 23a. The ohmic electrode 28 is in ohmic contact with the first conductivity type semiconductor layer 23a and is insulated from the second conductivity type semiconductor layer 23b. Although one single ohmic electrode 28 is shown in FIGS. 3A and 3B, a plurality of ohmic electrodes 28 are formed on the substrate 21 in the plurality regions of the light emitting device. The ohmic electrode 28 may be formed of, for example, an Au—Te alloy, an Au—Ge alloy, or others.

Figure 4A:
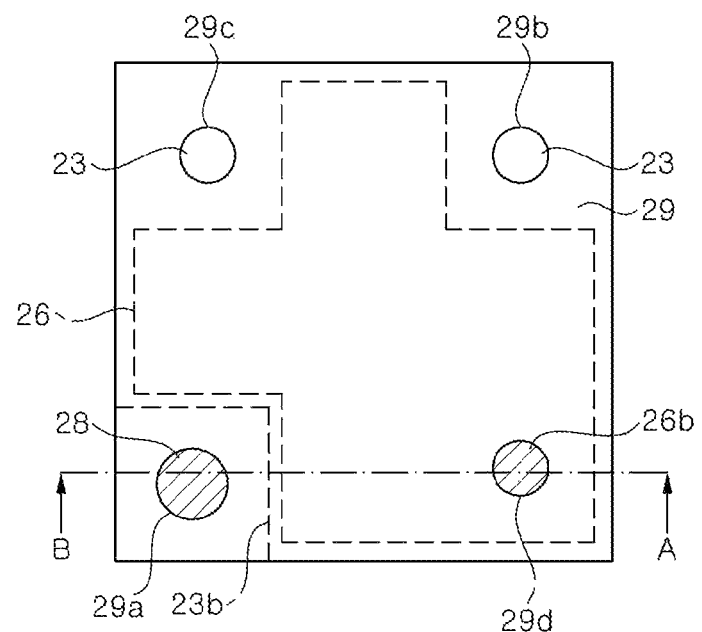
Figure 4B:
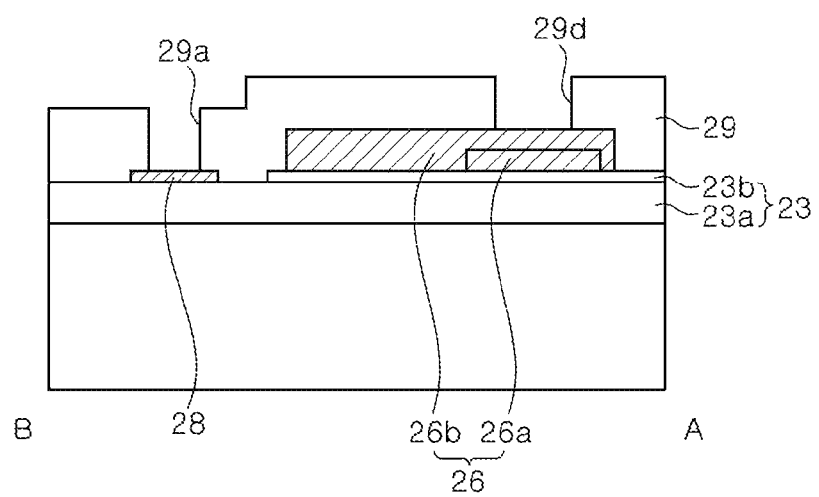

Referring to FIGS. 4A and 4B, an insulation layer 29 is formed on the first reflection electrode 26 and the ohmic electrode 28. The insulation layer 29 has openings 29a and 29d to expose each of the ohmic electrode 28 and the first reflection electrode 26, and openings 29b and 29c to expose the first LED stack 23. The insulation layer 29 is formed of, for example, $SiO_2$, $Si_3N_4$, SOG, or others, but the inventive concepts are not limited thereto, an may include light transmissive or opaque material. The openings 29a, 29b, 29c, and 29d may be disposed adjacent to four corners of each region of the light emitting device.

The second conductivity type semiconductor layer 23b of the first LED stack is exposed through the openings 29b and 29c, however, the inventive concepts are not limited thereto. For example, the second conductivity type semiconductor layer 23b may be partially removed in advance, and thus, the first conductivity type semiconductor layer 23a may be exposed through the openings 29b and 29c. As another example, connection pads may be formed on the first LED stack 23, and the connection pads may be exposed through the openings 29b and 29c. The connection pads may be formed together when the ohmic electrode 28 or the first reflection electrode 26 is formed.

Figure 5B:
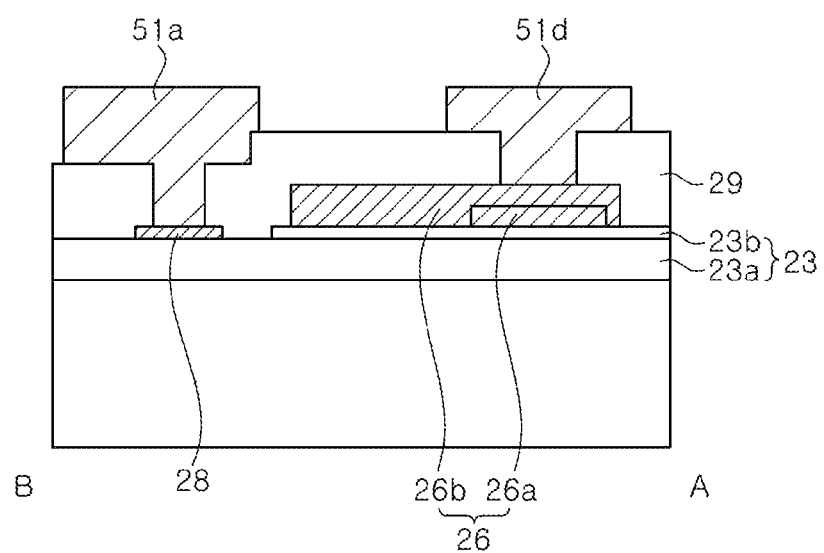

Referring to FIGS. 5A and 5B, electrode pads 51a, 51b, 51c, and 51d are formed on the first LED stack 23. The electrode pads 51a, 51b, 51c, and 51d are formed on the insulation layer 29. Hereinafter, the electrode pads 51a, 51b, and 51c are referred to as first, second, and third electrode pads, respectively, and the electrode pad 51d is referred to as a common electrode pad.

The first electrode pad 51a is connected to the ohmic electrode 28 through the opening 29a, and the second and third electrode pads 51b and 51c are connected to the first LED stack 23 exposed through the openings 29b and 29c. The common electrode pad 51d is connected to the first reflection electrode 26 through the opening 29d.

Figure 6:
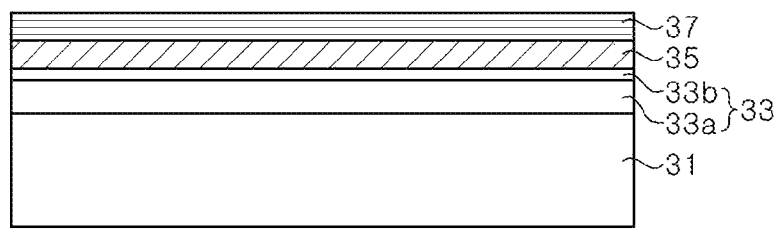

Referring to FIG. 6, a second LED stack 33 is grown on a second substrate 31, and a second transparent electrode 35 is formed on the second LED stack 33. The second LED stack 33 may be formed of gallium nitride semiconductor layers, and may include a first conductivity type semiconductor layer 33a, an active layer, and a second conductivity type semiconductor layer 33b. The active layer may include a GaInN well layer. The first conductivity type may be an n-type and the second conductivity type may be a p-type.

The second substrate 31 may be different from the first substrate 21 in that it is capable of growing a gallium nitride-based semiconductor layer. The composition of the GaInN well layer of the second LED stack 33 may be determined to emit green light, for example. The second transparent electrode 35 is in ohmic contact with the second conductivity type semiconductor layer 33b.

The second transparent electrode 35 may be formed of a metal layer or a conductive oxide layer transparent to red light, for example. In some exemplary embodiments, the second transparent electrode 35 may also be transparent to green light.

A first color filter 37 is formed on the second transparent electrode 35. The first color filter 37 transmits light generated in the first LED stack 23 and reflects light generated in the second LED stack 33. The first color filter 37 may be a low pass filter for passing only a low frequency region, e.g., a long wavelength region, a band pass filter for passing only a predetermined wavelength band or a band stop filter for blocking only a predetermined wavelength band. In particular, the first color filter 37 may be formed by alternately stacking insulation layers having different refractive indices. For example, $TiO_2$ and $SiO_2$, $Ta_2O_5$ and $SiO_2$, $Nb_2O_5$ and $SiO_2$, $HfO_2$ and $SiO_2$, or $ZrO_2$ and $SiO_2$ may be alternately stacked. In particular, the first color filter 37 may include a distributed Bragg reflector DBR. A stop band of the distributed Bragg reflector may be controlled by adjusting a thickness of $TiO_2$ and $SiO_2$. The low pass filter and the band pass filter may also be formed by alternately stacking insulation layers having different refractive indices.

Figure 7:
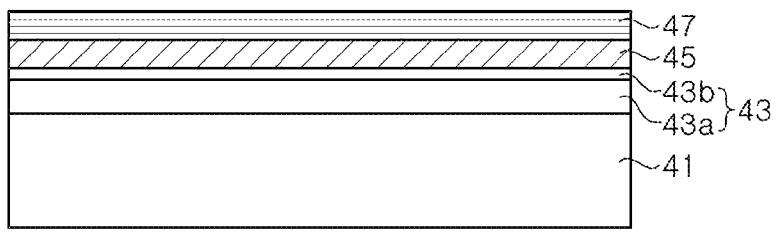

Referring to FIG. 7, a third LED stack 43 is grown on a third substrate 41, and a third transparent electrode 45 and a second color filter 47 are formed on the third LED stack 43. The third LED stack 43 may be formed of gallium nitride semiconductor layers, and includes a first conductivity type semiconductor layer 43a, an active layer, and a second conductivity type semiconductor layer 43b. The active layer may include a GaInN well layer. The first conductivity type may be an n-type and the second conductivity type may be a p-type.

The third substrate 41 may be different from the first substrate 21 in that it is capable of growing a gallium nitride-based semiconductor layer. The composition of the GaInN of the third LED stack 43 may be determined to emit blue light, for example. The third transparent electrode 45 is in ohmic contact with the second conductivity type semiconductor layer 43b.

The third transparent electrode 45 may be formed of a metal layer or a conductive oxide layer transparent to red light and green light, for example. Examples of the conductive oxide layer used for the second and third transparent electrodes 35 and 45 include $SnO_2$, $InO_2$, ITO, ZnO, IZO and the like.

The second color filter 47 transmits light generated in the first and second LED stacks 23 and 33, and reflects light generated in the third LED stack 43. The second color filter 47 may be formed by alternately stacking insulation layers having different refractive indices. For example, the second color filter 47 may be formed by alternately stacking $TiO_2$ and $SiO_2$. In particular, the second color filter 47 may include a distributed Bragg reflector DBR. A stop band of the distributed Bragg reflector may be controlled by adjusting a thickness of $TiO_2$ and $SiO_2$. A low pass filter and a band pass filter may also be formed by alternately stacking insulation layers having different refractive indices.

Figure 8A:
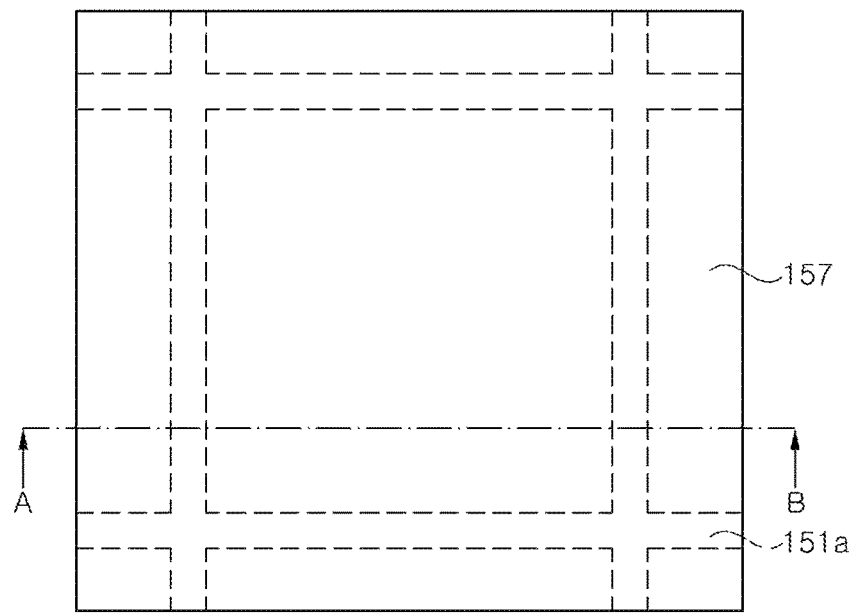
Figure 8B:
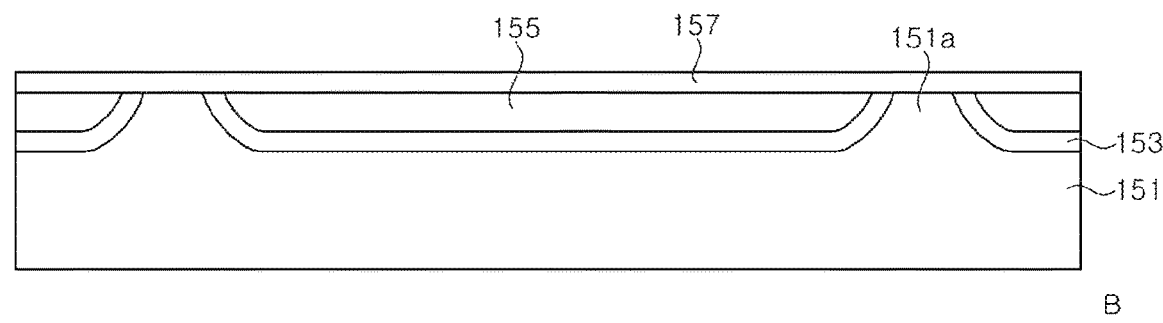

Referring to FIGS. 8A and 8B, a temporary support substrate 151 to support the first to third LED stacks 23, 33, and 43 is provided. The temporary support substrate 151 may have an anchor 151a on a surface thereof, and may include a protection layer 153, a sacrificial layer 155, and a membrane 157.

Figure 9A:
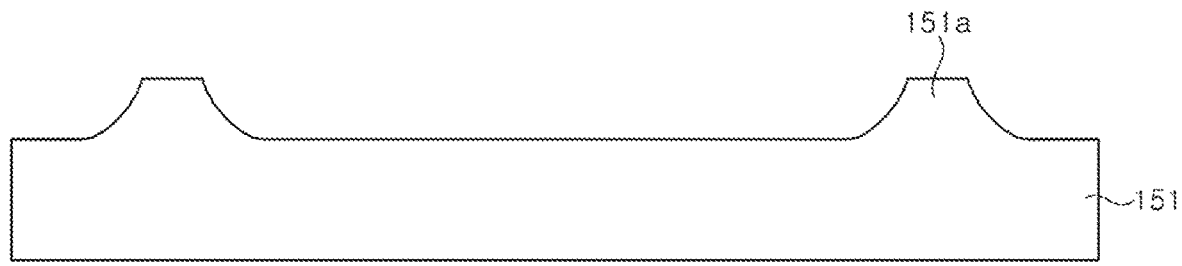
Figure 9B:
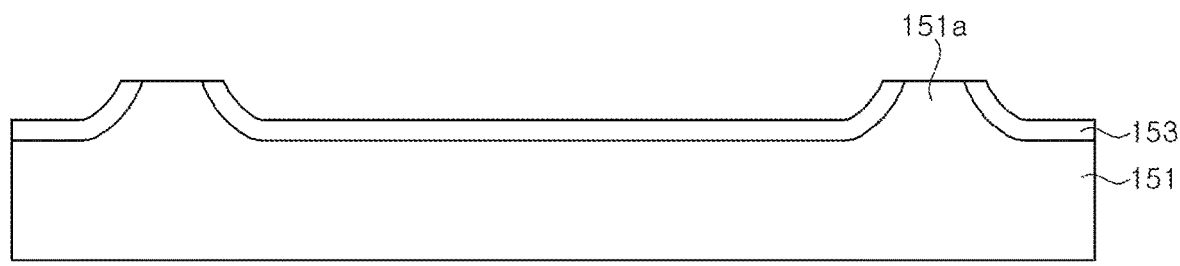
Figure 9C:
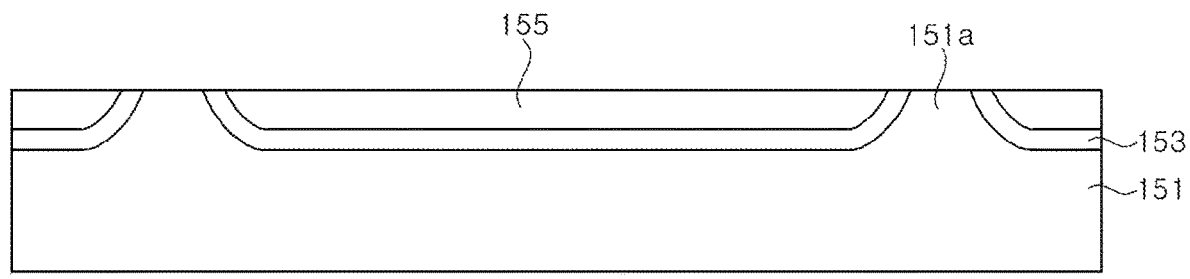
Figure 9D:
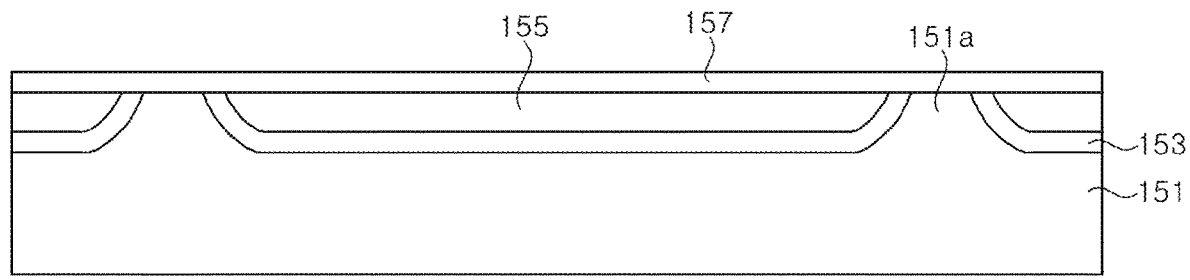
Figure 9E:
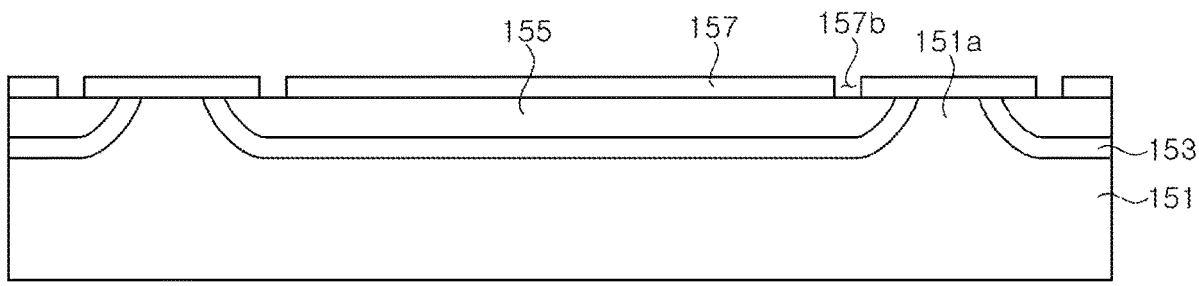
Figure 10A:
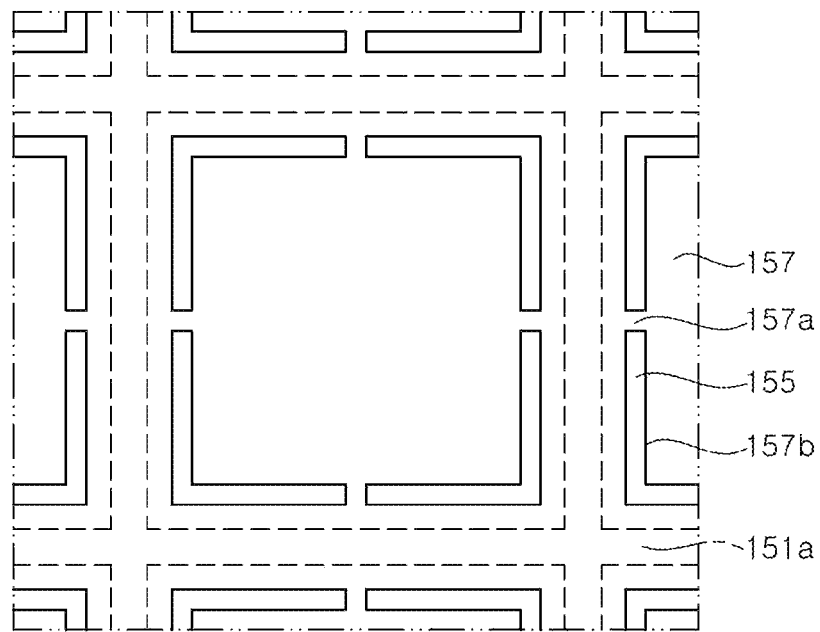
Figure 10B:
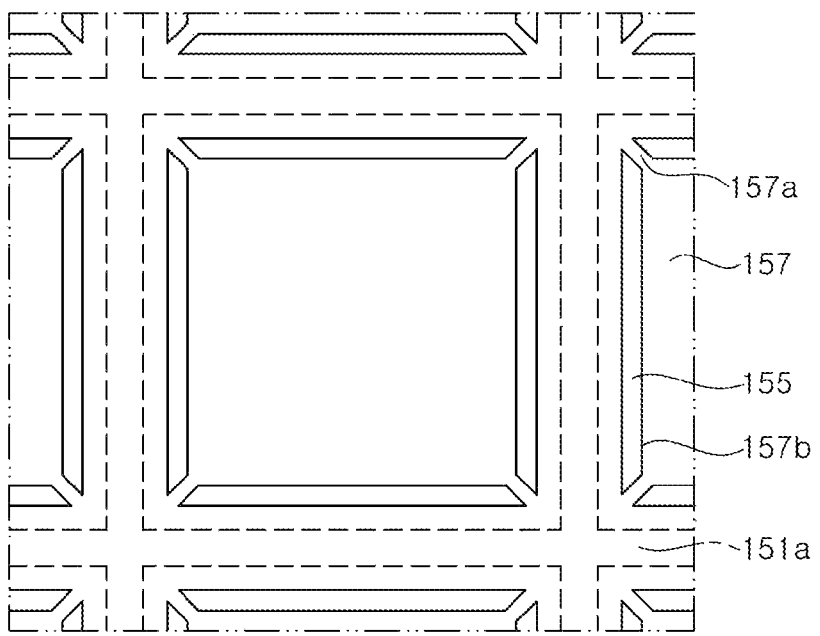
Figure 11A:
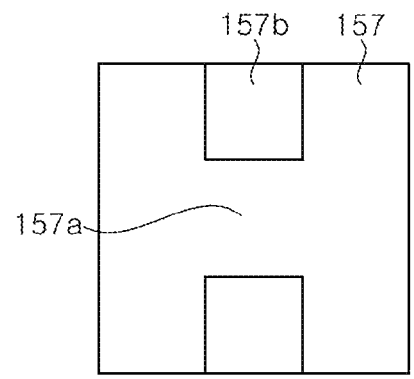
Figure 11B:
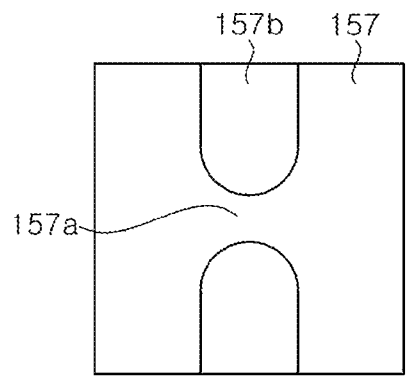
Figure 11C:
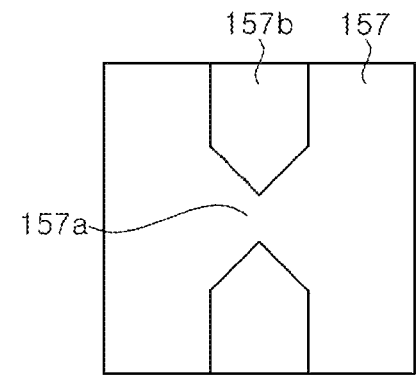
Figure 11D:
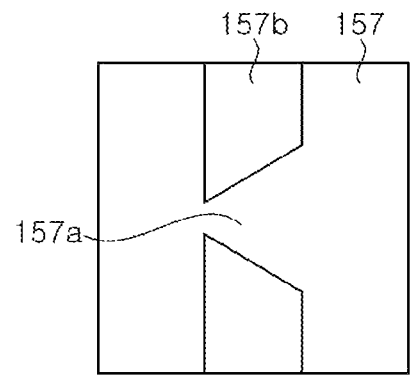
Figure 11E:
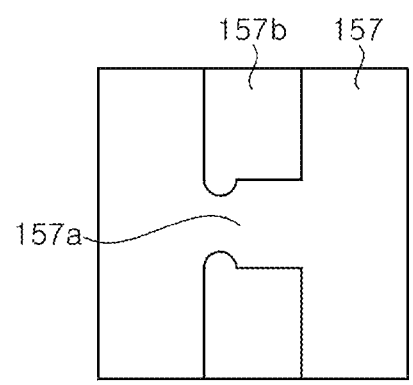
Figure 11F:
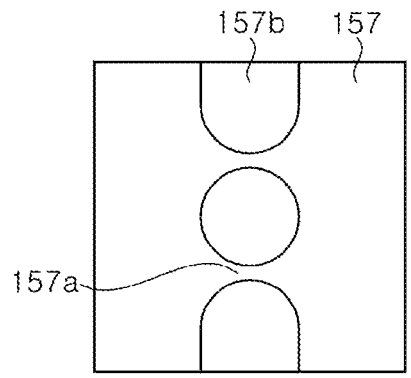
Figure 11G:
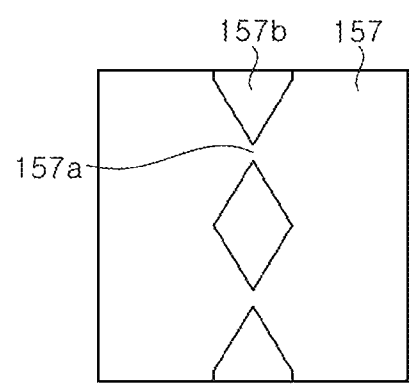

FIGS. 9A to 9E are cross-sectional views illustrating a method of manufacturing a temporary support substrate 151 according to an exemplary embodiment, and FIGS. 10A and 10B are plan views of the temporary support substrate 151 according to exemplary embodiments.

Referring to FIG. 9A, the anchor 151a is formed by etching a surface of the temporary support substrate 151, which may be formed of a silicon, for example. The anchor 151a may be formed in a substantially mesh shape, but the inventive concepts are not limited thereto, and the anchor 151a may be formed in various shapes.

Referring to FIG. 9B, the protection layer 153 is formed on the surface of the temporary support substrate 151. The protection layer 153 covers the surface of the temporary support substrate 151. The protection layer 153 may prevent the surface of the substrate 151 from being etched when the sacrificial layer 155 to be formed thereon is etched by an etchant. As such, the protection layer 153 is formed of a material layer resistant to the etchant of the sacrificial layer 155.

Referring to FIG. 9C, the sacrificial layer 155 is formed on the protection layer 153, and planarized until the anchor 151a is exposed. Accordingly, the sacrificial layer 155 is disposed in a limited region surrounded by the anchor 151a.

The sacrificial layer 155 may be formed of, for example, polysilicon, $SiO_2$, $SiN_x$, polymer, Ti, Ta, or others.

Referring to FIG. 9D, the membrane 157 covering the anchor 151a and the sacrificial layer 155 is formed.

Referring to FIG. 9E, an opening 157b exposing the sacrificial layer 155 is formed by patterning the membrane 157. In this case, a shape of the membrane 157 is maintained by the anchor 151a.

As shown in FIGS. 10A and 10B, the membrane 157 disposed in a region of the light emitting device may be connected to the membrane 157 attached to the anchor 151a by a fuse 157a.

The fuse 157a may be disposed at various locations and may be formed in various shapes. FIGS. 11A to 11F shows fuses 157a having various shapes according to exemplary embodiments.

The opening 157b formed in the membrane 157 may function as a passageway by which an etchant may be provided to remove the sacrificial layer 155. In this case, as the membrane 157 is resistant to the etchant, the membrane may maintain its shape during the process of removing the sacrificial layer 155. For example, when the sacrificial layer 155 includes polysilicon, $SF_6$ or $XeF_2$ may be used as the etchant, and the membrane may be formed of $SiO_2$ or SiNx. In another example, when the sacrificial layer 155 is formed of $SiO_2$, the etchant may include HF, and the membrane 157 may be formed of Si or SiNx. Further, when the sacrificial layer 155 is formed of $SiN_x$, the etchant may include $H_2PO_4$, and the membrane 157 may be formed of $SiO_2$ or Si. On the other hand, when the sacrificial layer 155 is formed of a polymer, the etchant may include $O_2$ or $F_2$, and the membrane 157 may be formed of Si, $SiO_2$, or $SiN_x$. In addition, when the sacrificial layer 155 is formed of Ti or Ta, the etchant may include $SF_6$, and the membrane 157 may be formed of Si, $SiO_2$, or $SiN_x$.

Although the fuse 157a is described as being formed on the temporary support substrate 151 in the illustrated exemplary embodiment, in some exemplary embodiments, the fuse 157a may be formed after bonding the first to third LED stacks 23, 33, and 43.

Hereinafter, a method of forming a light emitting diode stack 100 by bonding the first to third LED stacks 23, 33, and 43 on the temporary support substrate 151 will be described.

Figure 12A:
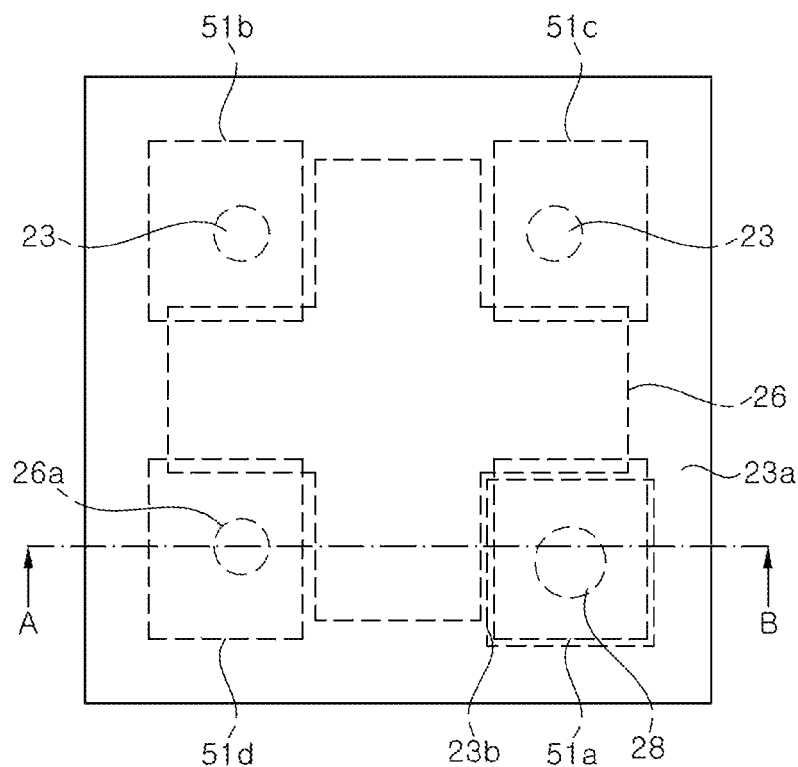
Figure 12B:
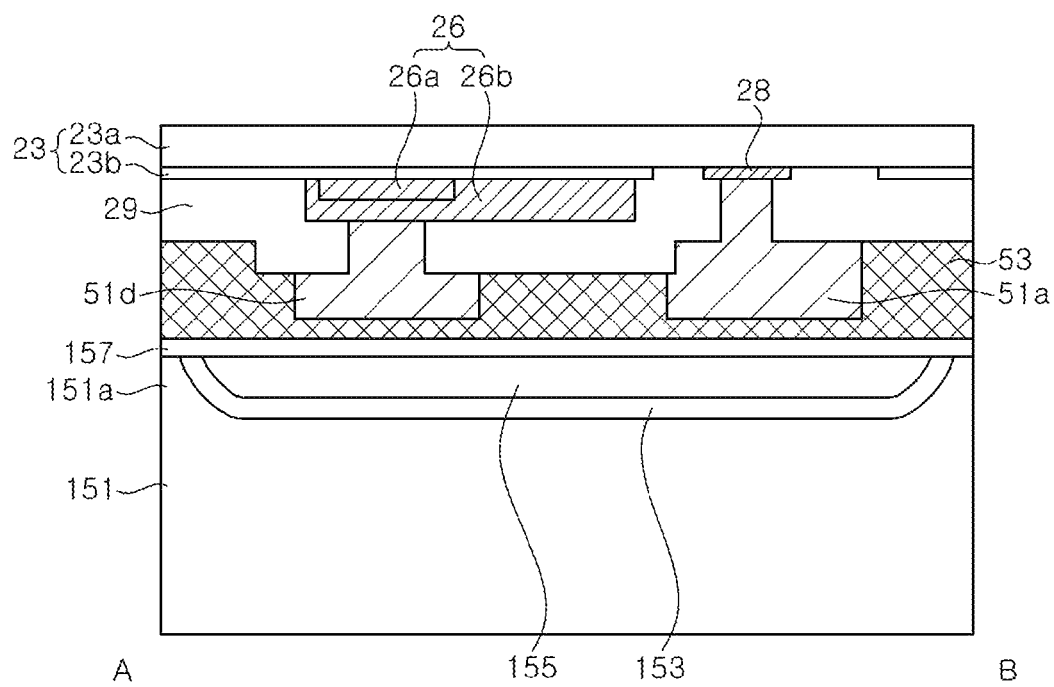

Referring to FIGS. 12A and 12B, the first LED stack is coupled to the temporary support substrate 151 by bonding the electrode pads 51a, 51b, 51c, and 51d shown in FIGS. 5A and 5B to the temporary support substrate 151. The electrode pads 51a, 51b, 51c, and 51d may be bonded to the temporary support substrate 151 through a first bonding layer 53. The first bonding layer 53 may be formed of a transparent organic material layer or a transparent inorganic material layer. Examples of the organic material layer includes SU8, poly methylmethacrylate (PMMA), polyimide, parylene, benzocyclobutene (BCB), or others. Examples of the inorganic material layer includes $Al_2O_3$, $SiO_2$, $SiN_x$, or others. The organic material layer may be bonded in a high vacuum and high pressure. A surface of the inorganic material layers may be flattened by, for example, a chemical mechanical polishing process, then a surface energy thereof may be controlled by using plasma or others, and may be bonded in a high vacuum.

For example, the bonding material layers are disposed on the temporary support substrate 151 and the electrode pads 51a, 51b, 51c, and 51d, respectively, and may be combined together to form the first bonding layer 53.

Subsequently, the substrate 21 is removed from the first LED stack 23. The substrate 21 may be removed from the first LED stack 23 through chemical etching, for example. Accordingly, the first conductivity type semiconductor layer 23a is exposed. In some exemplary embodiments, the exposed first conductivity type semiconductor layer 23a may be subjected to surface texturing to improve light extraction efficiency.

Figure 13A:
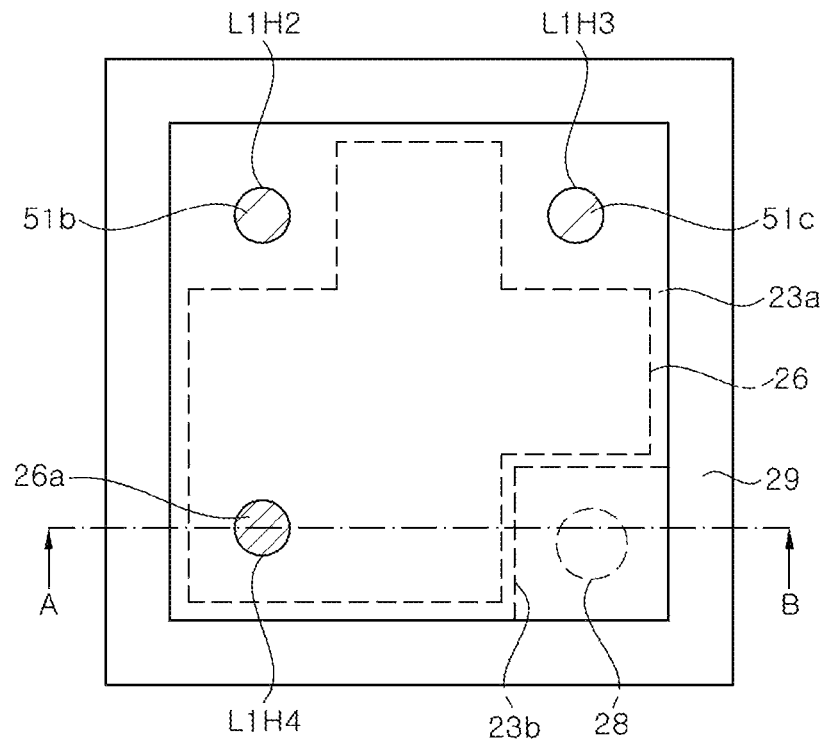
Figure 13B:
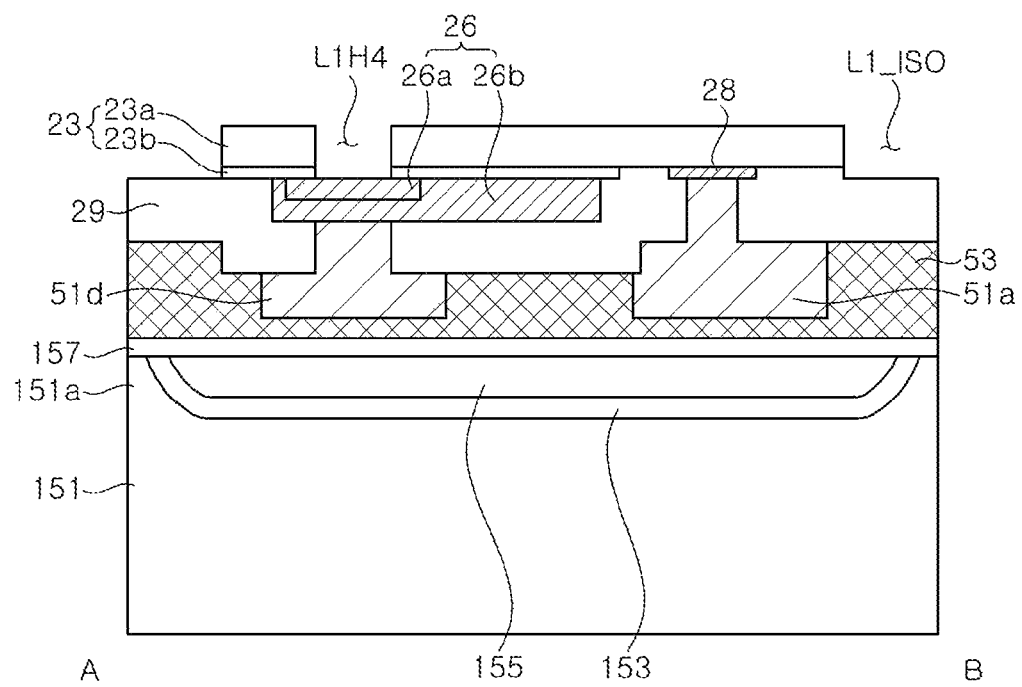

Referring to FIGS. 13A and 13B, holes L1H2, L1H3, and L1H4 are formed by patterning the exposed first LED stack 23. The hole L1H2 and the hole L1H3 expose the electrode pads 51b and 51c, respectively, and the hole L1H4 exposes a first reflection electrode 26. Although the holes L1H2 and L1H3 are shown as exposing the electrode pads 51b and 51c, in some exemplary embodiments, the holes L1H2 and L1H3 may expose the connection pads when the connection pads are disposed on the electrode pads. FIGS. 13A and 13B show that the ohmic contact layer 26a may be exposed through the hole L1H4, however, in some exemplary embodiments, the reflection layer 26b may be exposed by the hole L1H4.

Meanwhile, as shown in FIG. 13A, a portion of the first LED stack 23 disposed over the ohmic electrode 28 remains intact, and therefore, the ohmic electrode 28 is buried and not exposed. The first LED stack 23 may also be removed in a light emitting device isolation region L1_ISO while patterning the first LED stack 23, and thus the insulation layer 29 or the first bonding layer 53 may be exposed. In some exemplary embodiments, the insulation layer 29 and the first bonding layer 53 may be removed in the light emitting device isolation region L1_ISO.

Figure 14A:
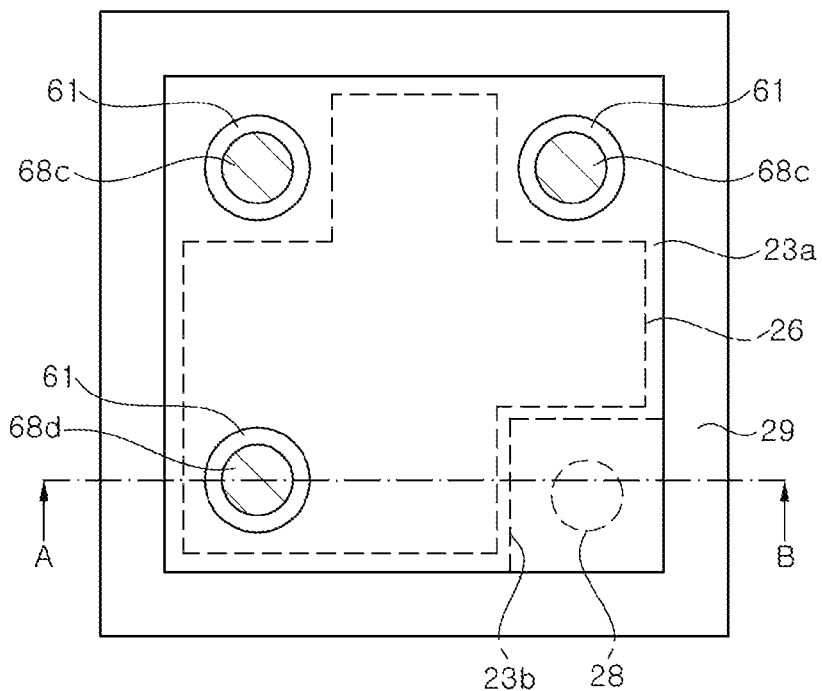
Figure 14B:
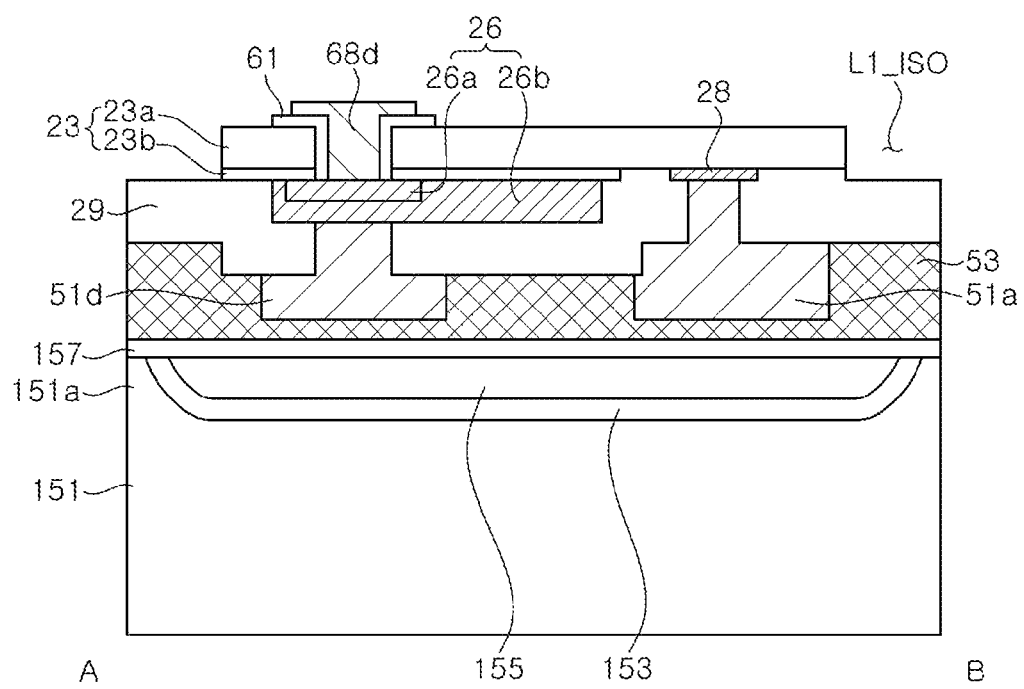

Referring to FIGS. 14A and 14B, an insulation layer 61 covering sidewalls of the holes L1H2, L1H3, and L1H4 and at least partially covering an upper surface of the first conductivity type semiconductor layer 23a is formed. The insulation layer 61 may be formed of $SiO_2$, or others. The insulation layer 61 exposes the first reflection electrode 26, the second electrode pad 51b, and the third electrode pad 51c in each of the holes.

Then, connectors 68b, 68c, and 68d are formed in each of the respective holes L1H2, L1H3, and L1H4. Hereinafter, the connectors 68b, 68c, and 68d may also be referred to as a second-1 connector, a third-1 connector, and a first common connector, respectively.

The connectors 68b, 68c and 68d are electrically connected to the second electrode pad 51b, the third electrode pad 51c, and the common electrode pad 51d, respectively. For example, the second-1 connector 68b may be directly connected to the second electrode pad 51b, the third-1 connector 68c may be directly connected to the third electrode pad 51c, and the first common connector 68d may be directly connected to the first reflection electrode 26. Each of the connectors 68b, 68c, and 68d may be formed to pass through the first LED stack 23.

The connectors 68b, 68c, and 68d may have pad areas on the first LED stack 23. However, the connectors 68b, 68c, and 68d are insulated from the first conductivity type semiconductor layer 23a by the insulation layer 61.

Figure 15A:
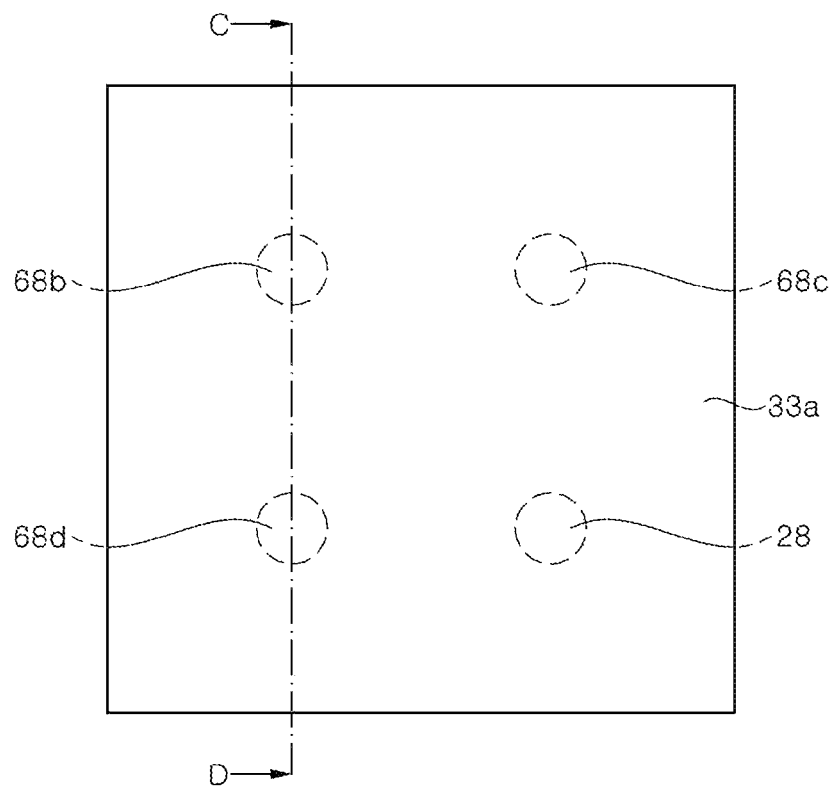
Figure 15B:
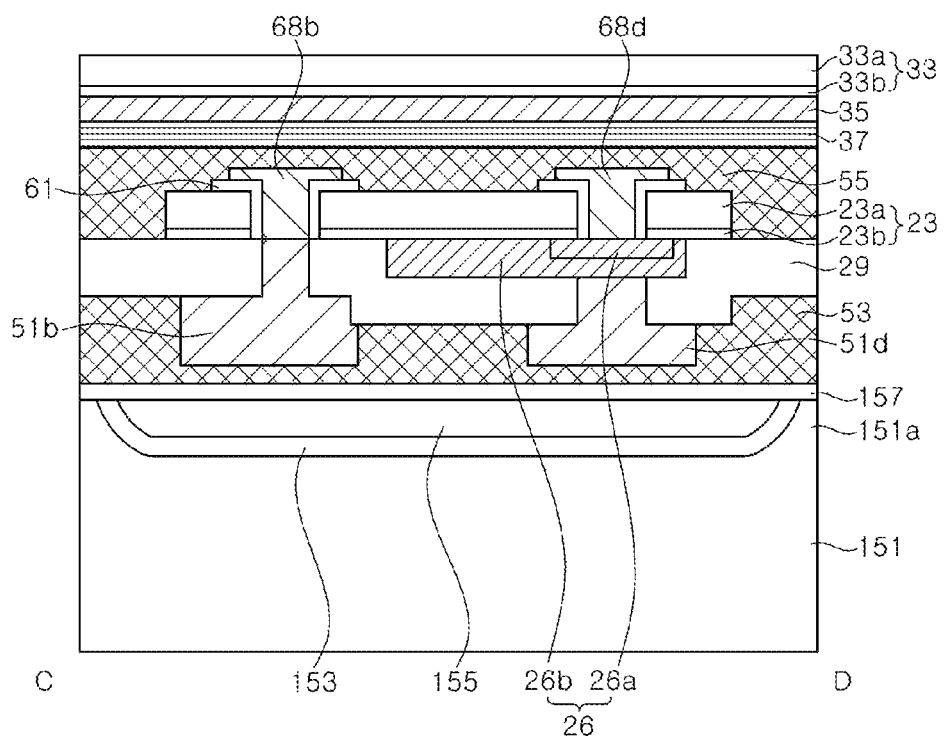

Referring to FIGS. 15A and 15B, the second LED stack 33 shown in FIG. 6 is bonded on the first LED stack 23. Bonding material layers may be formed on each of the first LED stack 23 and the first color filter 37, and a second bonding layer 55 may be formed by coupling the bonding material layers to face each other. The second bonding layer 55 may also contact the connectors 68b, 68c, and 68d. The second bonding layer 55 may include substantially the same material as the first bonding layer 53.

Thereafter, the second substrate 31 is removed from the second LED stack 33 by using techniques such as laser lift-off or chemical lift-off. Accordingly, the first conductivity type semiconductor layer 33a of the second LED stack 33 is exposed. The exposed first conductivity type semiconductor layer 33a may be subjected to surface texturing to form a rough surface.

Figure 16A:
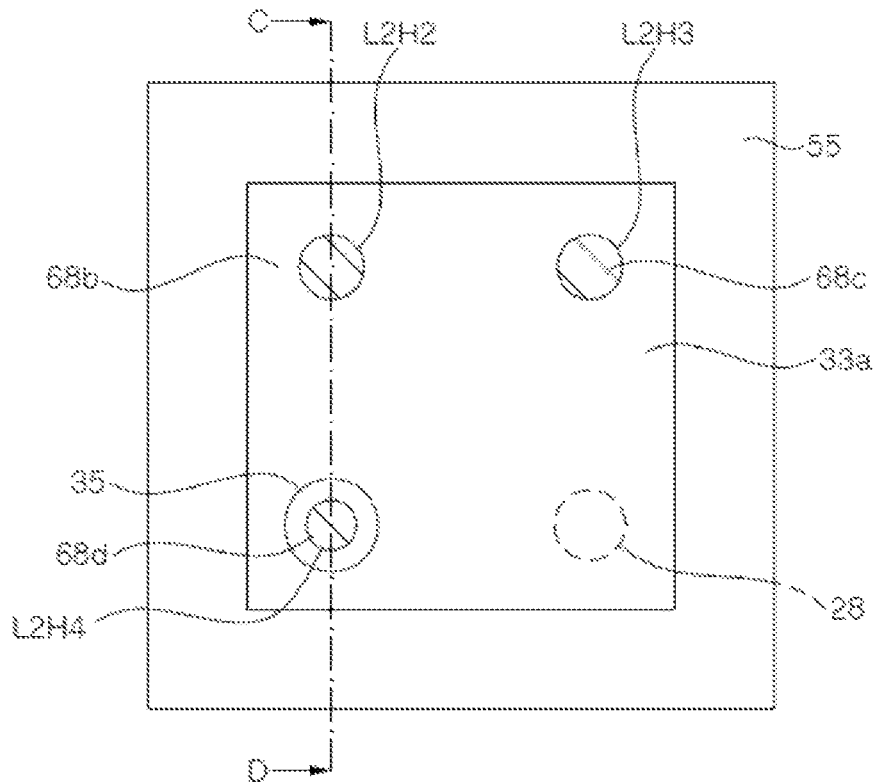
Figure 16B:
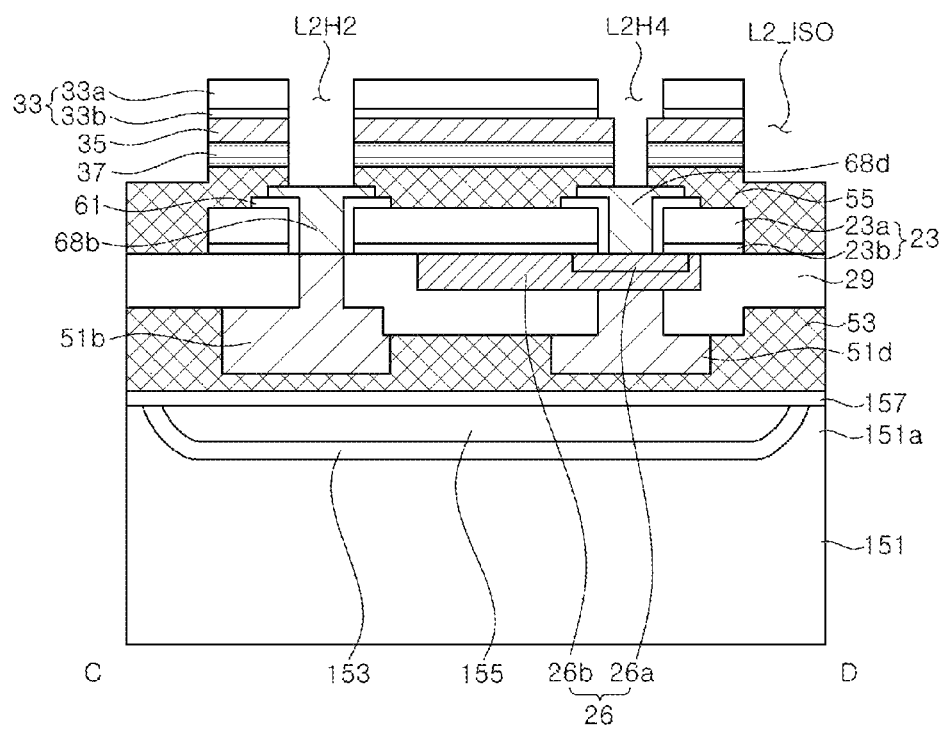

Referring to FIGS. 16A and 16B, holes L2H2, L2H3, and L2H4 are formed through the second LED stack 33. The holes L2H2, L2H3, and L2H4 may pass through the second LED stack 33, the second transparent electrode 35, the first color filter 37, and the second bonding layer 55. The connectors 68b, 68c, and 68d are exposed by the holes L2H2, L2H3, and L2H4. In addition, the hole L2H4 may partially expose an upper surface of the second transparent electrode 35.

A portion of the second LED stack 33 may be removed in the light emitting device isolation region L2_ISO, and thus, an upper surface of the second bonding layer 55 may be exposed in the light emitting device isolation region L2_ISO.

Figure 17A:
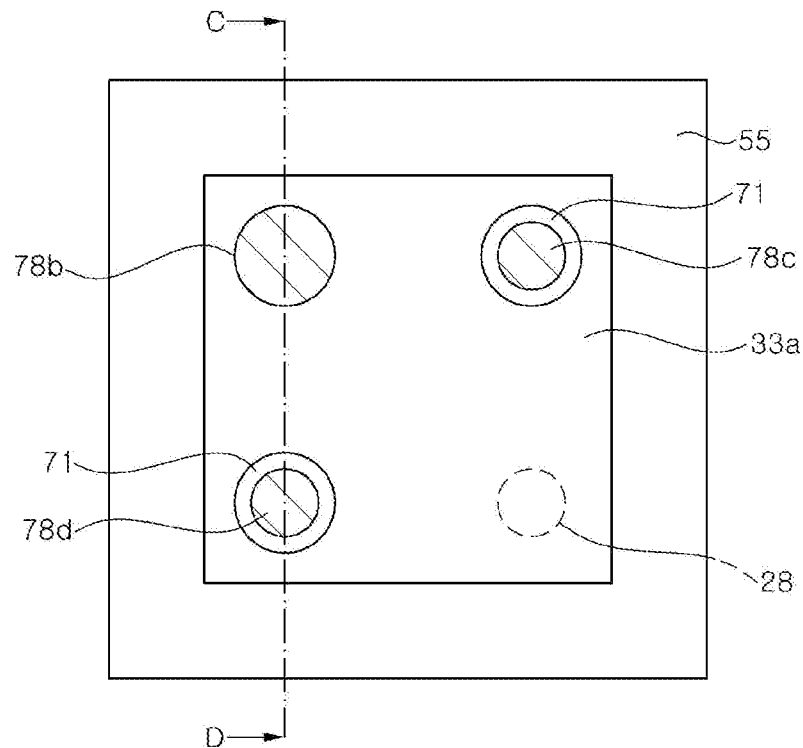
Figure 17B:
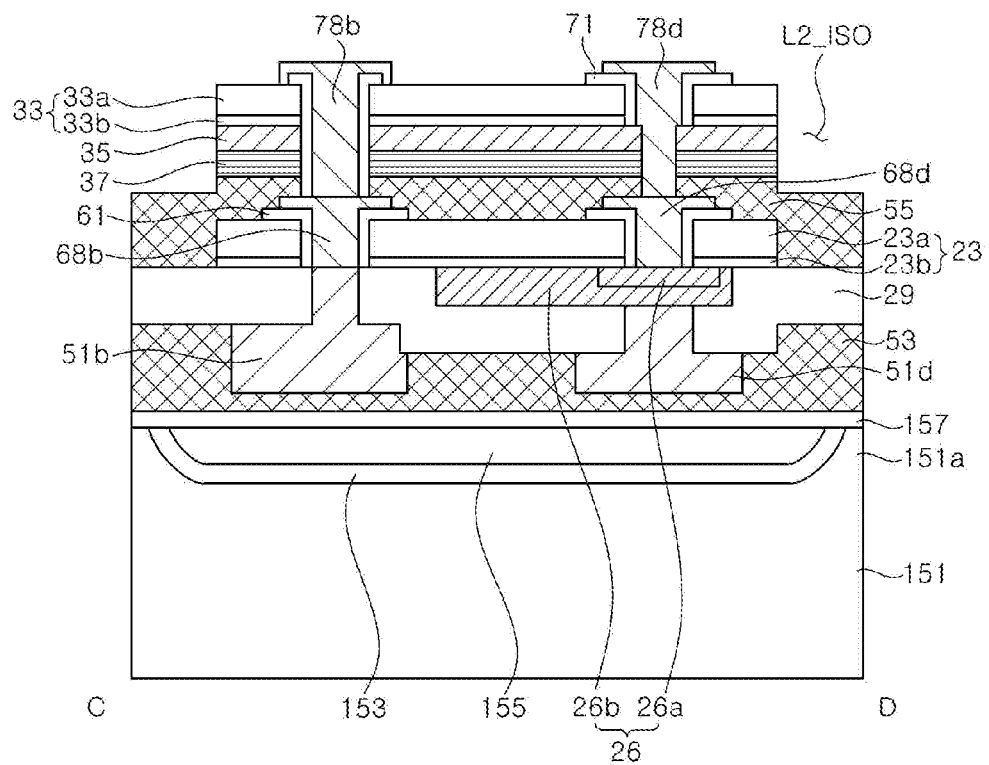

Referring to FIGS. 17A and 17B, an insulation layer 71 may be formed to cover sidewalls of the holes L2H2, L2H3, and L2H4. The insulation layer 71 may also partially cover an upper surface of the second LED stack 33.

Then, connectors 78b, 78c, and 78d are formed in the holes L2H2, L2H3, and L2H4. Hereinafter, the connector 78b may also be referred to as a second-2 connector, the connector 78c as a third-2 connector, and the connector 78d as a second common connector. These connectors 78b, 78c, and 78d may be formed to pass through the second LED stack 33.

The second-2 connector 78b electrically connects the first conductivity type semiconductor layer 33a to the second-1 connector 68b. As shown in the drawings, the second-2 connector 78b may be connected to an upper surface of the first conductivity type semiconductor layer 33a. To this end, the insulation layer 71 exposes the upper surface of the first conductivity type semiconductor layer 33a. In addition, the second-2 connector 78b may be connected to a pad region of the second-1 connector 68b. The third-2 connector 78c may be connected to the third-1 connector 68c, in particular, to a pad region of the third-1 connector 68c. The third-2 connector 78c is insulated from the second LED stack 33 by the insulation layer 71.

The second common connector 78d is connected to the first common connector 68d, and is also connected to the second transparent electrode 35 and electrically connected to the second conductivity type semiconductor layer 33b. The second common connector 78d may be connected to a pad region of the first common connector 68d. However, the second common connector 78d is insulated from the first conductivity type semiconductor layer 33a by the insulation layer 71.

Each of the third-2 connector 78c and the second common connector 78d may have a pad region at an upper end.

Figure 18A:
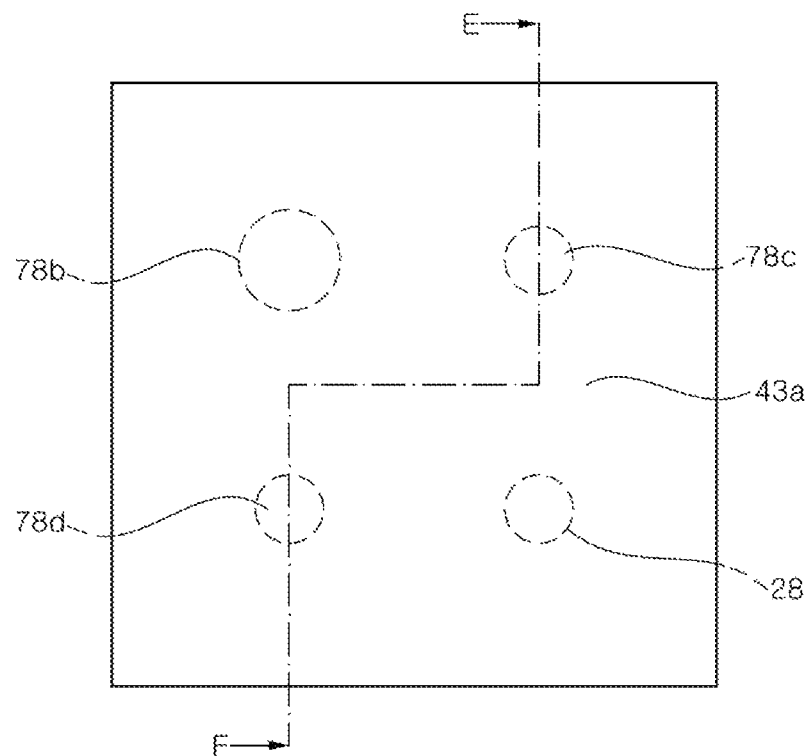
Figure 18B:
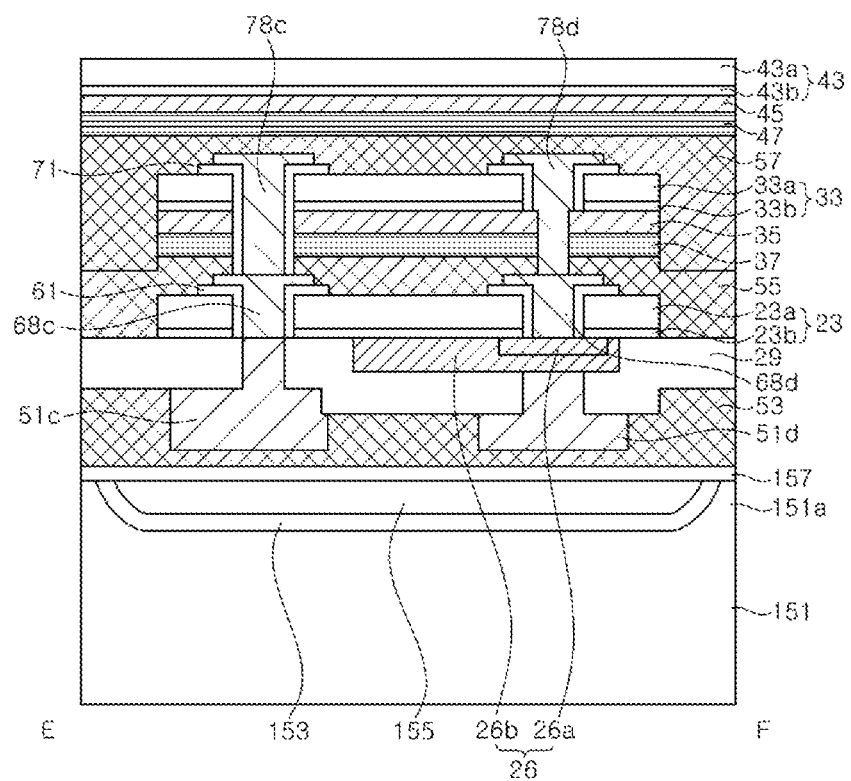

Referring to FIGS. 18A and 18B, the third LED stack 43 shown in FIG. 7 is bonded on the second LED stack 33. A bonding material layer is formed on the second LED stack 33 on which the connectors 78b, 78c, and 78d are formed, a bonding material layer is formed on the second color filter 47, and then these two bonding material layers may be combined together to form a third bonding layer 57. The third bonding layer 57 may include a substantially the same material as the first bonding layer 53.

The third substrate 41 is removed from the third LED stack 43 using techniques such as laser lift-off or chemical lift-off. Accordingly, the first conductivity type semiconductor layer 43a is exposed, and the exposed first conductivity type semiconductor layer 43a may be subjected to surface texturing to form a roughened surface.

As shown in the drawing, the third bonding layer 57 may be in contact with an upper surface and side surfaces of the second LED stack 33.

Figure 19A:
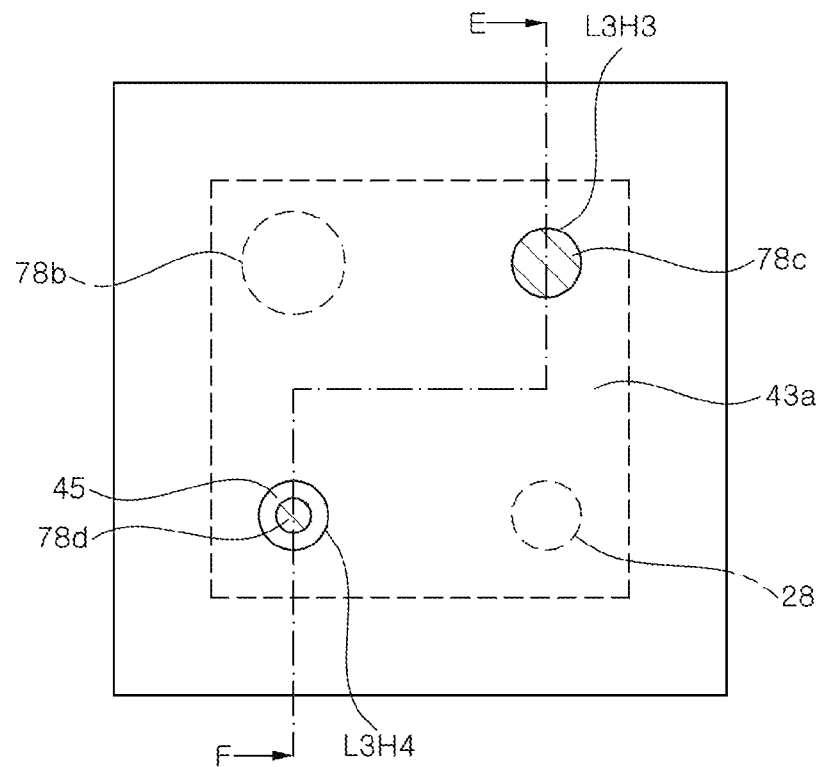
Figure 19B:
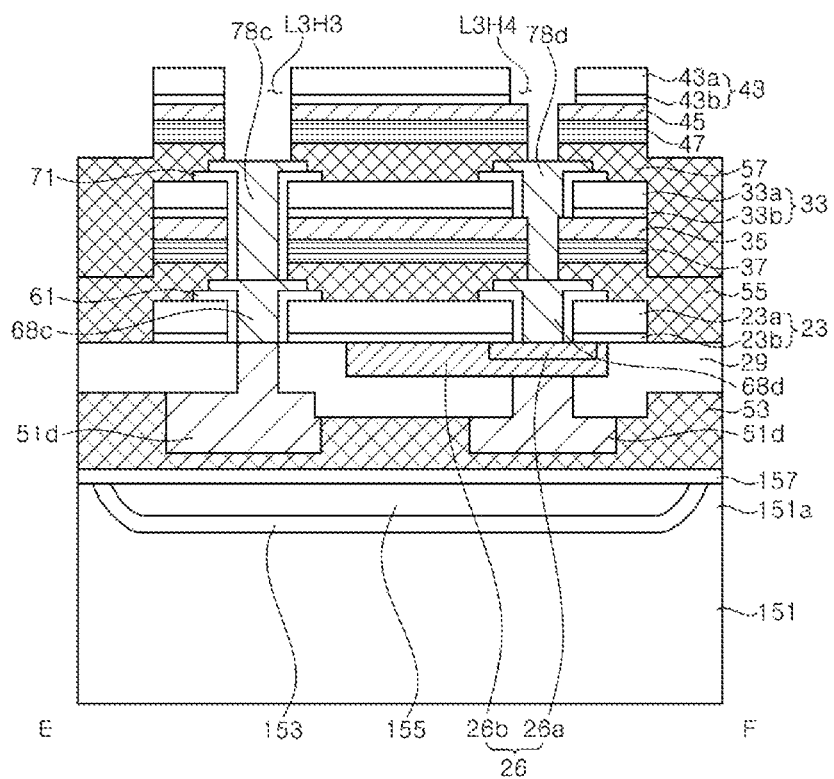

Referring to FIGS. 19A and 19B, holes L3H3 and L3H4 passing through the third LED stack 43 are formed to expose the connectors 78c and 78d. The holes L3H3 and L3H4 may pass through the third LED stack 43, the third transparent electrode 45, the second color filter 47, and the third bonding layer 57. The connector 78c is exposed by the hole L3H3, and the connector 78d is exposed by the hole L3H4. In addition, an upper surface of the third transparent electrode 45 is partially exposed by the hole L3H4. Meanwhile, the connector 78b is covered with the third LED stack 43.

Portions of the third LED stack 43, the third transparent electrode 45, and the second color filter 47 may be removed in the light emitting device isolation region, and the third bonding layer 57 may be exposed.

Figure 20A:
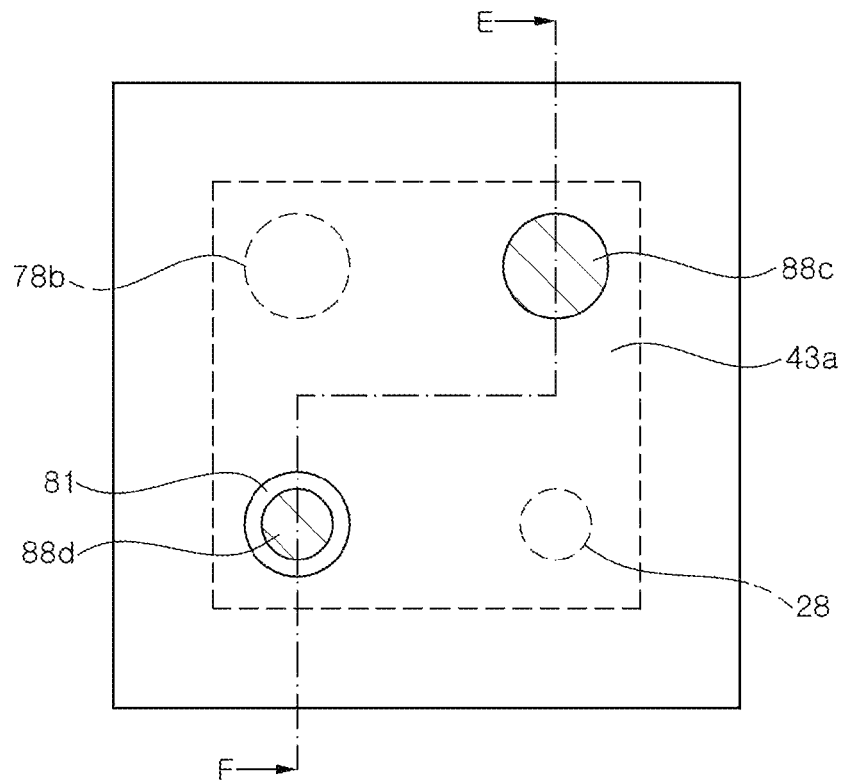
Figure 20B:
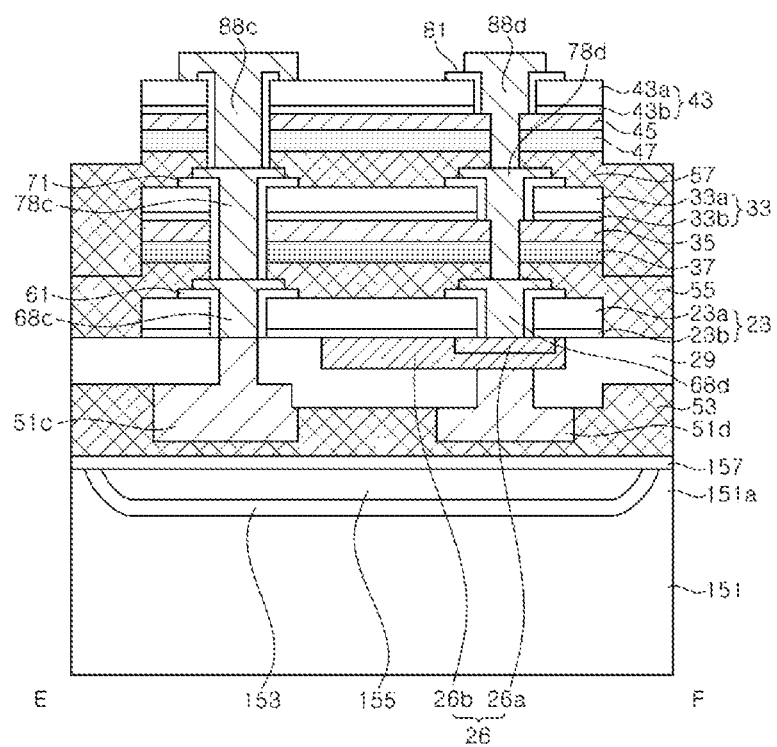

Referring to FIGS. 20A and 20B, an insulation layer 81 may be formed to cover sidewalls of the holes L3H3 and L3H4. The insulation layer 81 may also partially cover an upper surface of the third LED stack 43.

Then, connectors 88c and 88d are formed. Hereinafter, the connectors 88c and 88d are also referred to as a third-3 connector and a third common connector, respectively. The third-3 connector 88c connects the first conductivity type semiconductor layer 43a to the third-2 connector 78c. The third-3 connector 88c may be connected to an upper surface of the first conductivity type semiconductor layer 43a, and may be connected to a pad region of the third-2 connector 78c.

The third common connector 88d may be connected to the third transparent electrode 45 and also to the second common connector 78d. Accordingly, the second conductivity type semiconductor layer 43b of the third LED stack 43 is electrically connected to the common electrode pad 51d. The third common connector 88d is insulated from the first conductivity type semiconductor layer 43a by the insulation layer 81.

Figure 21A:
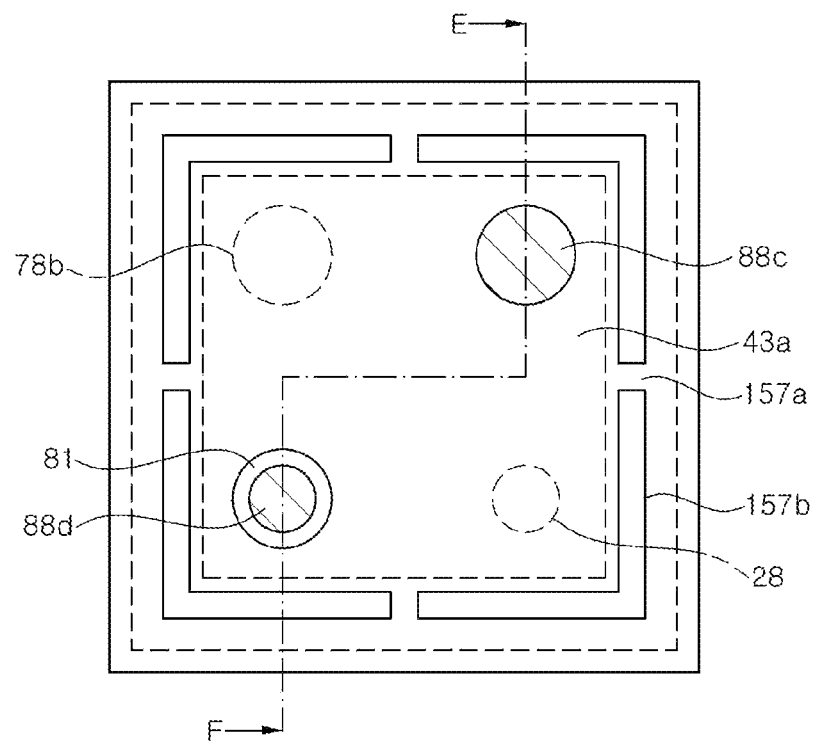
Figure 21B:
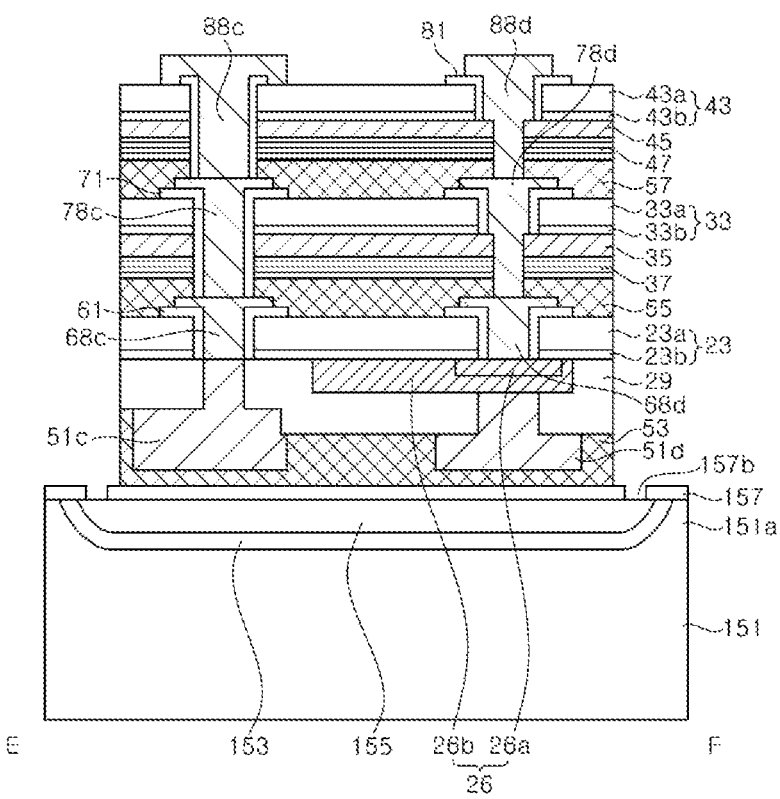

Referring to FIGS. 21A and 21B, portions of the third bonding layer 57, the second bonding layer 55, the insulation layer 29, and the first bonding layer 53 are sequentially removed in the light emitting device isolation region, and the membrane 157 on the temporary support substrate 151 is exposed. The exposed membrane 157 may have openings 157b exposing the sacrificial layer 155, and the fuse 157a may be formed to maintain the membrane 157 using the anchor 151a. When the membrane 157 is not patterned on the temporary support substrate 151, the openings 157b and the fuse 157a may be formed by patterning the membrane 157 after the bonding layers are removed in the light emitting device isolation region.

Then, the sacrificial layer 155 exposed through the openings 157b of the membrane 157 is removed. In particular, the sacrificial layer 155 may be removed by using an etching solution so that the sacrificial layer 155 is removed in a region surrounded by the anchor 151a, and the membrane 157 is attached to the anchor 151a and supported by the anchor 151a.

Figure 22:

As shown in FIG. 22, a plurality of light emitting diode stacks 100 are arranged on the temporary support substrate 151, and are maintained by being attached on the membrane 157.

Hereafter, a method of manufacturing a light emitting device 200 using the light emitting diode stacks 100 disposed on the temporary support substrate 151 will be described.

Figure 23A:
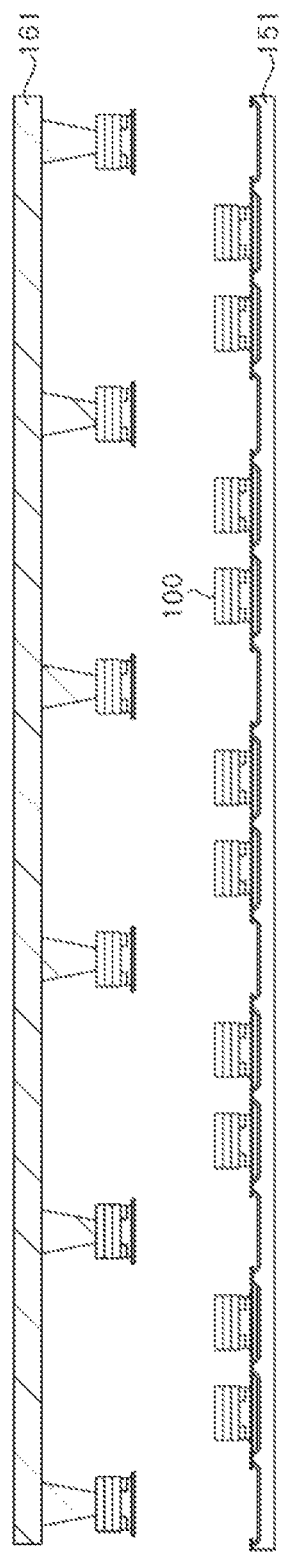
Figure 23B:
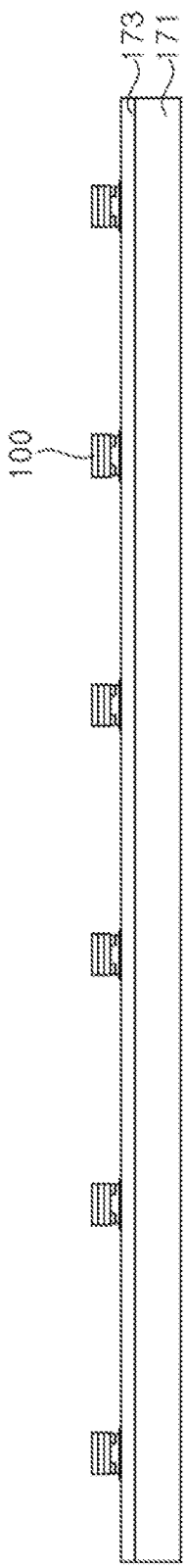

Referring to FIGS. 23A and 23B, the light emitting diode stacks 100 arranged at regular intervals are separated from a temporary support substrate 151, and transferred to a molding substrate 171 using a picker 161. An adhesive layer 173 may be disposed on a surface of the molding substrate 171, and the light emitting diode stacks 100 may be attached to the adhesive layer 173.

Electrode pads 51a, 51b, 51c, and 51d disposed on a lower surface of the light emitting diode stack 100 are covered with the first bonding layer 53, and the light emitting diode stack 100 may be attached to the molding substrate 171 in a state that the first bonding layer 53 is covered with the membrane 157.

In this manner, the light emitting diode stacks 100 are formed on the molding substrate 171 at relatively larger intervals than those of the light emitting diode stacks 100 disposed on the temporary support substrate 151.

Figure 23C:
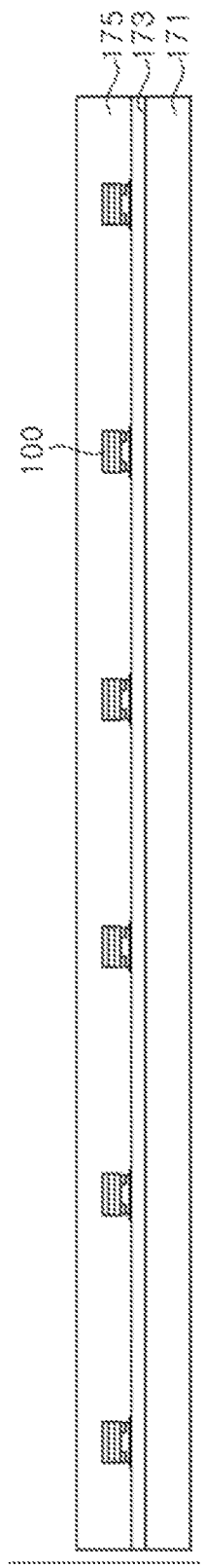

Then, referring to FIG. 23C, a molding member 175 is formed on the molding substrate 171. The molding member 175 covers and molds the light emitting diode stacks 100. The molding member 175 is transparent to light emitted from the first to third LED stacks 23, 33, and 43.

Figure 23D:
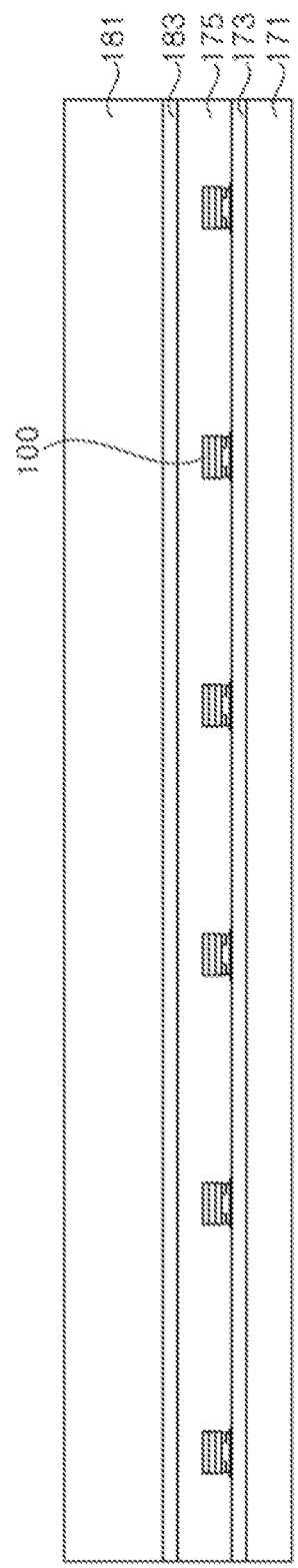
Figure 23E:
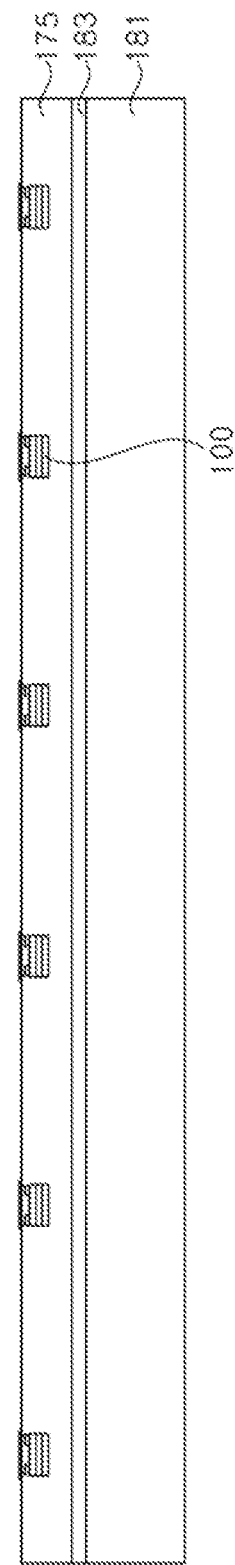

Referring to FIGS. 23D and 23E, a carrier substrate 181 is attached on the molding member 175, and the molding substrate 171 is removed. Accordingly, the light emitting diode stacks 100 are disposed on the carrier substrate 181 with the electrode pads 51a, 51b, 51c, and 51d disposed thereon. An adhesive layer 183 may be disposed on a surface of the carrier substrate 181, and the molding member 175 may be attached to the adhesive layer 183.

Figure 23F:
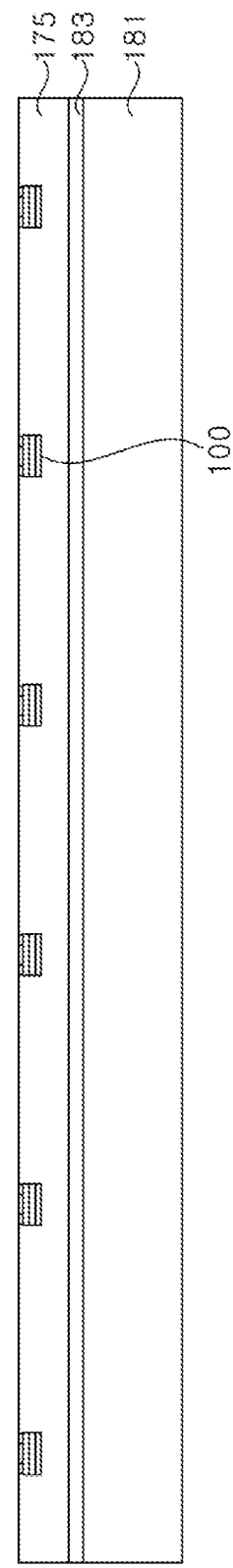

Subsequently, referring to FIG. 23F, the electrode pads 51a, 51b, 51c, and 51d are exposed. The first bonding layer 53 and the molding member 175 disposed on the electrode pads 51a, 51b, 51c, and 51d are removed by grinding or others, so that the electrode pads 51a, 51b, 51c, and 51d may be exposed.

Figure 23G:
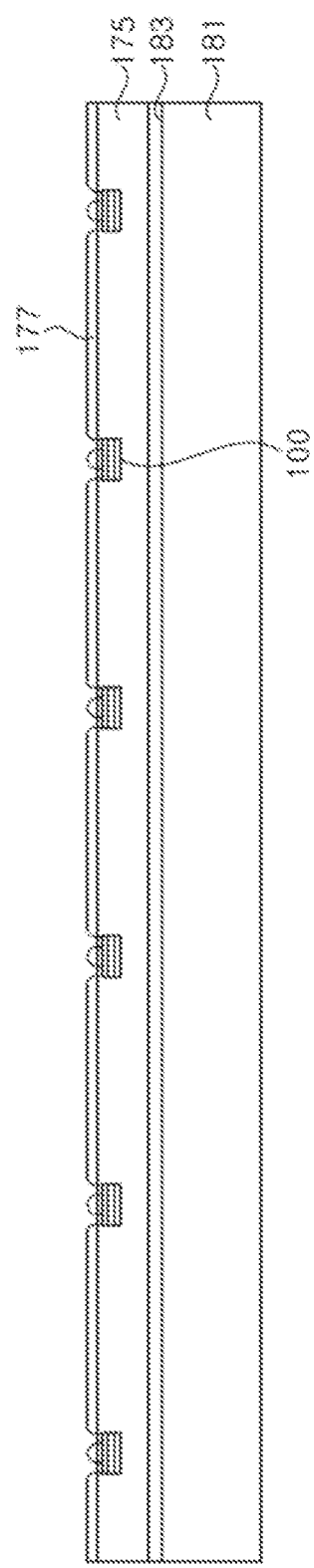

Thereafter, referring to FIG. 23G, a lower insulation layer 177 is formed. The lower insulation layer 177 is subjected to patterning to have openings to expose the electrode pads 51a, 51b, 51c, and 51d. The lower insulation layer 177 may be formed of a transparent insulation layer, but the inventive concepts are not limited thereto, and the lower insulation layer 177 may be a white or black insulation layer. Examples of the transparent insulation layer include SU8, polyimide, penylene, or others, an example of the white insulation layer includes white PSR (photo sensitive resist), and an example of the black insulation layer includes black epoxy.

Figure 23H:
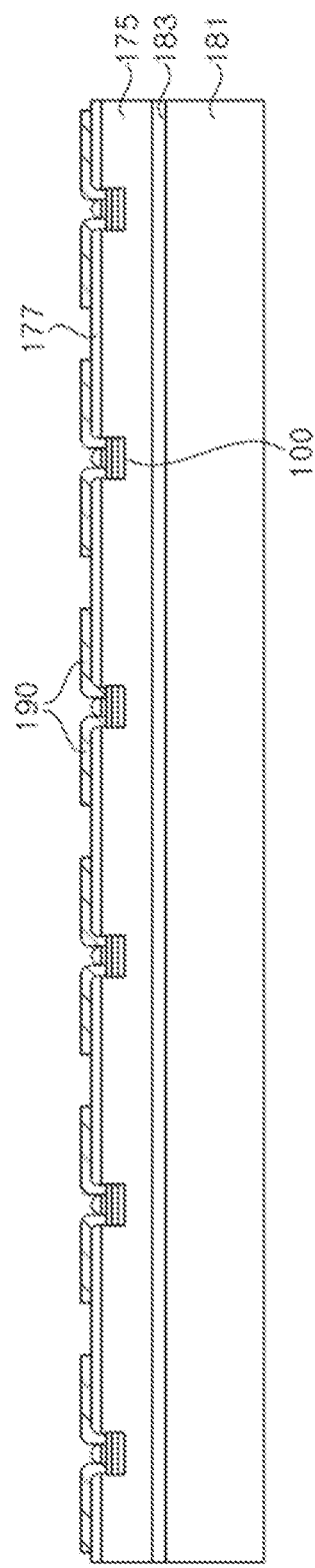

Referring to FIG. 23H, lead electrodes 190 are formed. As shown in FIGS. 2A and 2B, the lead electrodes 190 may include first to third lead electrodes 190a, 190b, and 190c, and a common lead electrode 190d, which are connected to the electrode pads 51a, 51b, 51c and 51d, respectively.

Figure 23I:
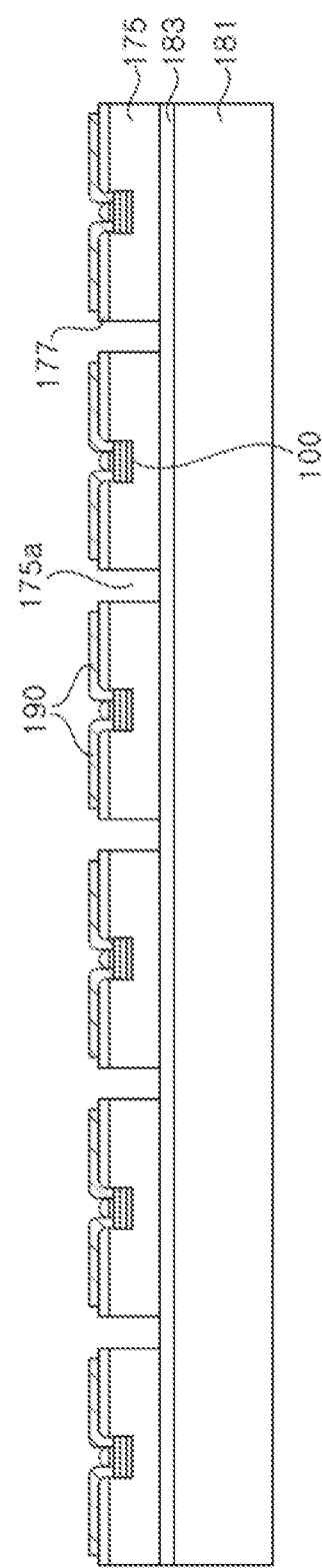

Then, referring to FIG. 23I, the molding member 175 is diced together with the lower insulation layer 177 to be separated into individual light emitting devices. Accordingly, the light emitting device 200 described with reference to FIGS. 2A and 2B is provided. At this stage, a probe test may be performed using the lead electrodes 190 to determine whether each light emitting device 200 is defective, and the light emitting devices 200 of good qualities may be chosen.

Meanwhile, in some exemplary embodiments, a reflection layer or a light blocking layer may be formed to cover side walls of the molding member 175.

According to the exemplary embodiments, the light emitting device 200 may include first to third LED stacks 23, 33, 43, in which anodes of each LED stack are commonly electrically connected, and cathodes of each LED stack are connected independently. However, the inventive concepts are not limited thereto, and the anodes of the first to third LED stacks 23, 33, and 43 may be independently connected to electrode pads, and the cathodes thereof may be commonly electrically connected.

The light emitting device 100 may emit red, green, and blue light from the first to third LED stacks 23, 33, and 43, and thus, may be used as one pixel in a display apparatus. A display apparatus according to the exemplary embodiments may include a plurality of light emitting devices 200 on the circuit board 101. Since the light emitting device 200 includes the first to third LED stacks 23, 33, and 43, an area of the subpixel in one pixel may be increased. Further, since the first to third LED stacks 23, 33, and 43 may be mounted by mounting one light emitting device 200, the number of mounting processes may be reduced significantly.

The light emitting devices 200 mounted on the circuit board 101 according to exemplary embodiments may be driven by a passive matrix method or an active matrix method.

According to exemplary embodiments, the light emitting device 200 may be manufactured in various ways different from described above. In addition, the temporary support substrate 151 may be formed differently from those described with reference to FIGS. 9A to 9E, and the temporary support substrate 151 may be formed using a glass substrate or a sapphire substrate.

FIGS. 24A to 24D are schematic cross-sectional views illustrating a method of forming a temporary support substrate 251 using a glass substrate according to an exemplary embodiment.

Figure 24A:
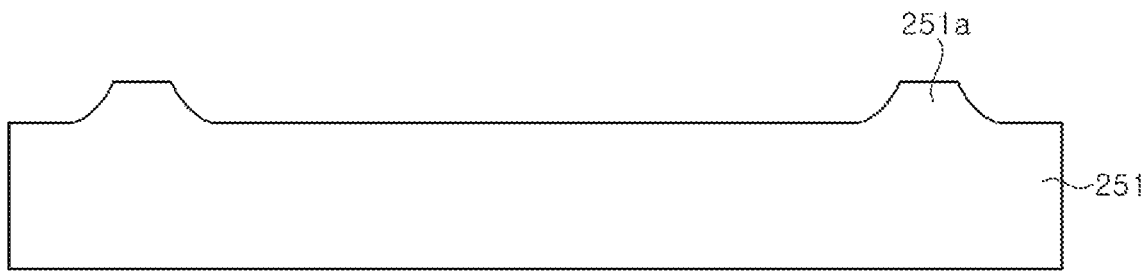
FIGS. 24A, 24B, 24C, and 24D are schematic cross-sectional views illustrating a method of manufacturing a temporary support substrate according to an exemplary embodiment.

Referring to FIG. 24A, a surface of the substrate 251 is partially etched to form an anchor 251a. The anchor 251a is substantially similar to the anchor 151a described with reference to FIG. 9A, and thus, detailed descriptions thereof will be omitted to avoid redundancy.

Figure 24B:
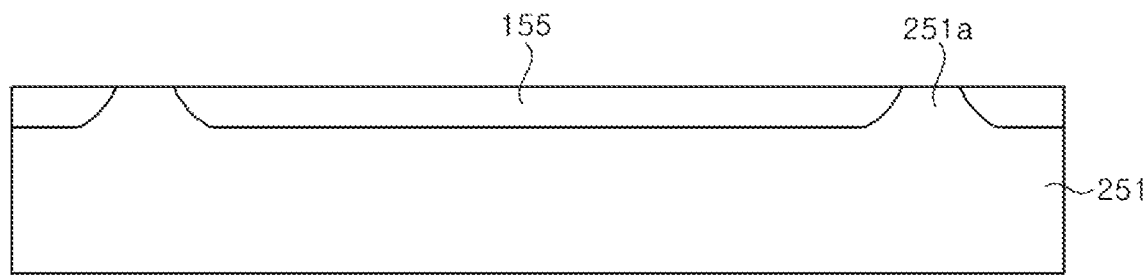

Thereafter, referring to FIG. 24B, a sacrificial layer 155 is formed. A sacrificial layer covering the surface of the substrate 251 may be deposited and planarized to expose a surface of the anchor 251a so that the sacrificial layer 155 is disposed in a limited region surrounded by the anchor 251a.

In the illustrated exemplary embodiment, the protection layer 153 may be omitted as the glass substrate has a relatively large etching selectivity ratio with respect to that of the sacrificial layer 155.

Figure 24C:
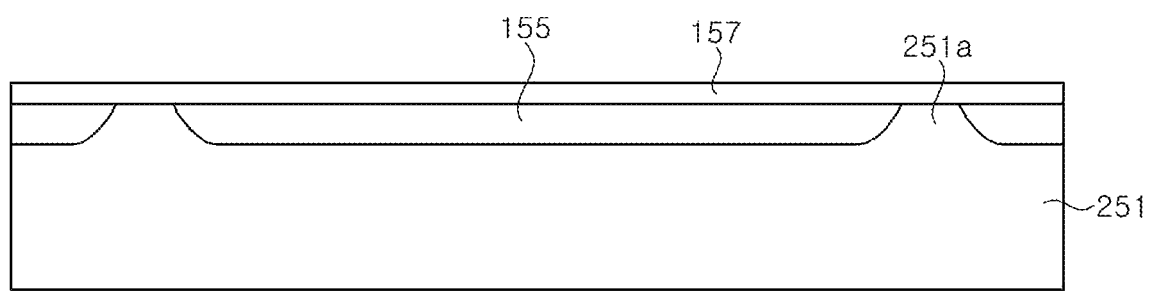
Figure 24D:
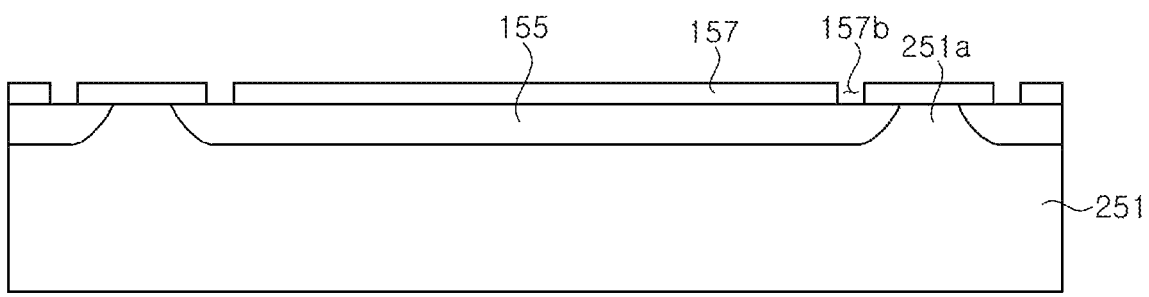

Then, referring to FIGS. 24C and 24D, a membrane 157 covering the sacrificial layer 155 and the anchor 251a may be formed, and the membrane 157 may be subject to patterning to form openings 157b and a fuse 157a.

FIGS. 25A to 25D are schematic cross-sectional views illustrating a method of forming a temporary support substrate 351 using a substrate having a high intensity, such as a sapphire substrate, according to another exemplary embodiment.

Figure 25A:
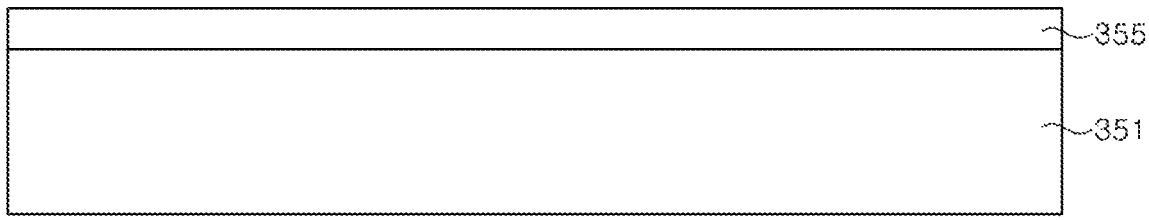
FIGS. 25A, 25B, 25C, and 25D are schematic cross-sectional views illustrating a method of manufacturing a temporary support substrate according to another exemplary embodiment.

Referring to FIG. 25A, a sacrificial layer 355 is formed on the substrate 351. Since it is generally difficult to form an anchor by patterning the sapphire substrate, in an exemplary embodiment, the step of patterning the sapphire substrate may be omitted.

Figure 25B:
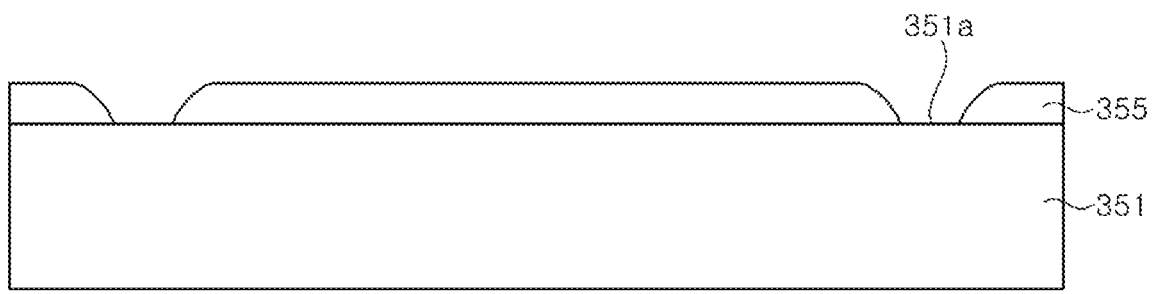

Thereafter, referring to FIG. 25B, the sacrificial layer 355 is subject to patterning to expose a surface of the substrate 351. The surface of the exposed substrate 351 may function as an anchor 351a. Accordingly, the exposed surface may have a shape of the anchor 151a as shown in FIG. 9A, and the sacrificial layer 355 may be surrounded by the anchor 351a.

Figure 25C:
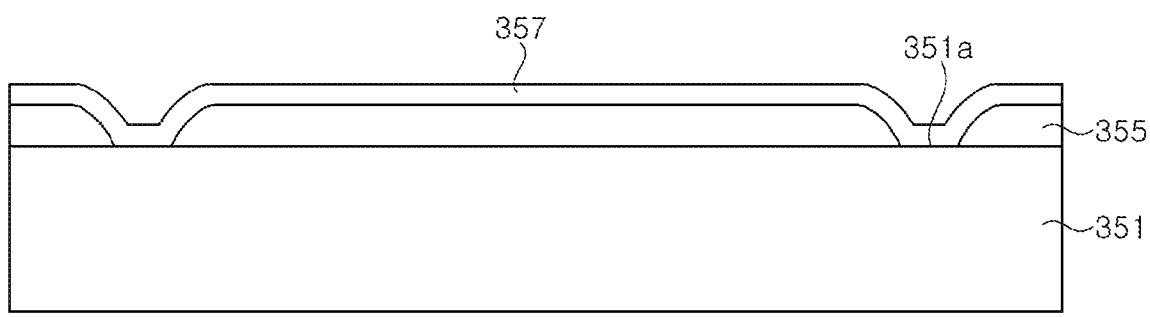

Referring to FIG. 25C, a membrane 357 is formed on the sacrificial layer 355. The membrane 357 covers the sacrificial layer 355 and the anchor 351a, and is attached to the anchor 351a.

Figure 25D:
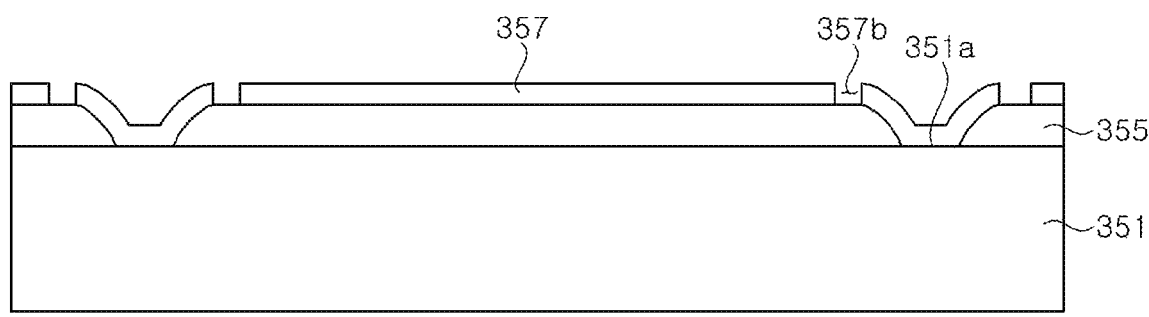

Then, referring to FIG. 25D, the membrane 357 is subject to patterning to form openings 357b, and a fuse is formed between the openings 357b.

The temporary support substrates 251 and 351 may be used in place of the temporary support substrate 151, and the light emitting device 200 may be manufactured through substantially the same process.

The first to third LED stacks 23, 33, and 43 in the light emitting device 200 according to an exemplary embodiment may emit light of a longer wavelength as being disposed closer to the electrode pads 51a, 51b, 51c, and 51d. For example, the first LED stack 23 may be an inorganic light emitting diode emitting red light, the second LED stack 33 may be an inorganic light emitting diode emitting green light, and the third LED stack 43 may be an inorganic light emitting diode emitting blue light. The first LED stack 23 may include a GaInP-based well layer, and the second LED stack 33 and the third LED stack 43 may include a GaInN-based well layer.

Since the first LED stack 23 may emit light having a longer wavelength than the second and third LED stacks 33 and 43, light generated in the first LED stack 23 may be emitted outside through the second and third LED stacks 33 and 43 and the substrate 41. In addition, since the second LED stack 33 may emit light having a longer wavelength than the third LED stack 43, light generated in the second LED stack 33 may be emitted outside through the third LED stacks 43 and the substrate 41. However, the inventive concepts are not limited thereto. When the light emitting device includes a micro LED, which has a surface area less than about 10,000 square µm as known in the art, or less than about 4,000 square µm or 2,500 square µm in other exemplary embodiments, the first LED stack 23 may emit any one of red, green, and blue light, and the second and third LED stacks 33 and 43 may emit a different one of red, green, and blue light, without adversely affecting operation, due to the small form factor of a micro LED.

Meanwhile, the first LED stack 23, the second LED stack 33, and the third LED stack 43 may have the first conductivity type semiconductor layers 23a, 33a, and 43a subjected to surface texturing to improve light extraction efficiency. However, when the second LED stack 33 emits green light, since the green light has a higher visibility than the red light or the blue light, it may be desirable to increase light emitting efficiencies of the first LED stack 23 and the third LED stack 43 than that of the second LED stack 33. Accordingly, surface texturing may be applied to the first LED stack 23 and the third LED stack 43 to improve the light extraction efficiency while the second LED stack 33 is used without any or with less surface texturing to adjust a brightness of red light, green light, and blue light to be substantially uniform to each other.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
a first LED sub-unit laterally extending along a first direction;
a second LED sub-unit disposed on the first LED sub-unit;
a third LED sub-unit disposed on the second LED sub-unit;
electrode pads disposed under the first LED sub-unit, each of the electrode pads overlapping at least a portion of the first LED sub-unit along a vertical direction and being electrically connected to at least one of the first LED sub-unit, the second LED sub-unit, and the third LED sub-unit;
lead electrodes electrically connected to the electrode pads, each of the lead electrodes extending outwardly away from respective outer ends of the first, second, and third LED sub-units in the first direction to respective outer ends of the light emitting device, and at least a portion of each of the lead electrodes overlapping the first LED sub-unit in the vertical direction;
a single, molding member having an outer boundary and covering each of the first LED sub-unit, the second LED sub-unit, and the third LED sub-unit; and
a lower insulation layer disposed under the molding member between the electrode pads and the lead electrodes in a second direction normal to the first direction,
wherein the outer ends of the lead electrodes terminate short of the outer boundary of the molding member when viewed in plan.

2. The light emitting device of claim 1, wherein:
the first LED sub-unit, the second LED sub-unit, and the third LED sub-unit are independently drivable;
light generated from the first LED sub-unit is configured to be emitted to the outside of the light emitting device through the second LED sub-unit and the third LED sub-unit; and
light generated from the second LED sub-unit is configured to be emitted to the outside of the light emitting device through the third LED sub-unit.

3. The light emitting device of claim 2, wherein the first, second, and third LED sub-units comprise first, second, and third LED stacks configured to emit red light, green light, and blue light, respectively.

4. The light emitting device of claim 1, wherein the lead electrodes have bonding pads disposed on an outer side of the first LED sub-unit.

5. The light emitting device of claim 1, wherein the lead electrodes are connected to the electrode pads through the lower insulation layer.

6. The light emitting device of claim 5, wherein the lower insulation layer comprises at least one of a transparent insulation layer, a white insulation layer, and a black insulation layer.

7. The light emitting device of claim 1, wherein:
the electrode pads comprise:
a common electrode pad commonly electrically connected to the first, second, and third LED sub-units; and
first, second, and third electrode pads electrically connected to the first, second, and third LED sub-units, respectively; and
the lead electrodes comprise:
a common lead electrode electrically connected to the common electrode pad; and
first, second, and third lead electrodes electrically connected to the first, second, and third electrode pads, respectively.

8. The light emitting device of claim 7, further comprising:
an ohmic electrode in ohmic contact with a first conductivity type semiconductor layer of the first LED sub-unit; and
a first reflection electrode interposed between the electrode pads and the first LED sub-unit, and in ohmic contact with the first LED sub-unit,
wherein:
the first electrode pad is electrically connected to the ohmic electrode; and
the common electrode pad is electrically connected to the first reflection electrode at a lower portion of the first reflection electrode.

9. The light emitting device of claim 8, wherein the first reflection electrode comprises an ohmic contact layer in ohmic contact with a second conductivity type semiconductor layer of the first LED sub-unit, and a reflection layer covering the ohmic contact layer.

10. The light emitting device of claim 9, further comprising:
a second transparent electrode interposed between the first LED sub-unit and the second LED sub-unit, and in ohmic contact with a lower surface of the second LED sub-unit;
a third transparent electrode interposed between the second LED sub-unit and the third LED sub-unit, and in ohmic contact with a lower surface of the third LED sub-unit; and
a common connector connecting the second transparent electrode and the third transparent electrode to the first reflection electrode,
wherein the common connector is electrically connected to the first reflection electrode at an upper portion of the first reflection electrode, and to the common electrode pad through the first reflection electrode.

11. The light emitting device of claim 10, wherein:
the common connector comprises a first common connector passing through the first LED sub-unit, a second common connector electrically connecting the second transparent electrode and the first common connector, and a third common connector electrically connecting the third transparent electrode and the second common connector; and
the first common connector and the second common connector have pad regions to connect the second common connector and the third common connector, respectively.

12. The light emitting device of claim 10, further comprising:
a first color filter interposed between the first LED sub-unit and the second transparent electrode; and
a second color filter interposed between the second LED sub-unit and the third transparent electrode,
wherein:
the first color filter transmits light generated in the first LED sub-unit, and reflects light generated in the second LED sub-unit; and
the second color filter transmits light generated in the first and second LED sub-units, and reflects light generated in the third LED sub-unit.

13. The light emitting device of claim 10, further comprising:
a second connector to electrically connect the second LED sub-unit and the second electrode pad; and
a third connector to electrically connect the third LED sub-unit and the third electrode pad,
wherein:
the second connector is electrically connected to a first conductivity type semiconductor layer of the second LED sub-unit; and
the third connector is electrically connected to a first conductivity type semiconductor layer of the third LED sub-unit.

14. The light emitting device of claim 13, wherein at least one of the second connector and the third connector directly contacts the first conductivity type semiconductor layer.

15. The light emitting device of claim 13, wherein:
the second connector comprises a second lower connector passing through the first LED sub-unit and a second upper connector passing through the second LED sub-unit; and
the third connector comprises a third lower connector passing through the first LED sub-unit, a third middle connector passing through the second LED sub-unit, and a third upper connector passing through the third LED sub-unit.

16. The light emitting device of claim 1, further comprising connectors to electrically connect the second and third LED sub-units to the electrode pads,
wherein the connectors and the electrode pads comprise different materials from each other.

17. The light emitting device of claim 1, wherein the molding member comprises a transparent molding member.

18. The light emitting device of claim 1, wherein the lower insulation layer is interposed between the lead electrodes and a bottom surface of the molding member facing away from the first, second, and third LED sub-units in the second direction.

19. The light emitting device of claim 1, wherein an outermost side surface of the molding member that defines the outer boundary is substantially flush with an outermost side surface of the lower insulation layer.

20. The light emitting device of claim 1, wherein at least a portion of the lower insulation layer and the lead electrodes do not overlap each of the first, second, and third LED sub-units in the second direction when viewed in plan.

21. A display apparatus comprising:
a circuit board laterally extending along a first direction; and
a plurality of light emitting devices arranged on the circuit board, at least one of the light emitting devices including:
a first LED sub-unit;
a second LED sub-unit disposed on the first LED sub-unit;
a third LED sub-unit disposed on the second LED sub-unit;
electrode pads disposed under the first LED sub-unit, each of the electrode pads overlapping at least a portion of the first LED sub-unit along a vertical direction and being electrically connected to at least one of the first, second, and third LED sub-units;
lead electrodes electrically connected to the electrode pads, each of the lead electrodes extending outwardly away from respective outer ends of the first, second, and third LED sub-units in the first direction to respective outer ends of the light emitting device, and at least a portion of each of the lead electrodes overlapping the first LED sub-unit in the vertical direction;
a single, molding member having an outer boundary and covering each of the first LED sub-unit, the second LED sub-unit, and the third LED sub-unit; and
a lower insulation layer disposed under the molding member between the electrode pads and the lead electrodes in a second direction normal to the first direction,
wherein the electrode pads of the light emitting device are electrically connected to the circuit board, and
wherein the outer ends of the lead electrodes terminate short of the outer boundary of the molding member when viewed in plan.

* * * * *